US010923494B2

(12) United States Patent
Clampitt et al.

(10) Patent No.: US 10,923,494 B2
(45) Date of Patent: Feb. 16, 2021

(54) ELECTRONIC DEVICES COMPRISING A SOURCE BELOW MEMORY CELLS AND RELATED SYSTEMS

(71) Applicant: Micron Technology, Inc., Boise, ID (US)

(72) Inventors: Darwin A. Clampitt, Wilder, ID (US); David H. Wells, Boise, ID (US); John D. Hopkins, Meridian, ID (US); Kevin Y. Titus, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/194,946

(22) Filed: Nov. 19, 2018

(65) Prior Publication Data
US 2020/0161325 A1 May 21, 2020

(51) Int. Cl.
*H01L 27/11582* (2017.01)
*H01L 27/11521* (2017.01)
(Continued)

(52) U.S. Cl.
CPC .... *H01L 27/11582* (2013.01); *H01L 21/0228* (2013.01); *H01L 21/02532* (2013.01);
(Continued)

(58) Field of Classification Search
CPC ............ H01L 27/115; H01L 27/11514; H01L 27/11524; H01L 27/11529;
(Continued)

(56) References Cited

U.S. PATENT DOCUMENTS 9,741,737 B1 8/2017 Huang et al.
2009/0073782 A1 3/2009 Hanafi et al.
(Continued)

FOREIGN PATENT DOCUMENTS

CN 104205342 A 4/2017
CN 107968091 A 4/2018

OTHER PUBLICATIONS

U.S. Appl. No. 16/194,926, filed Nov. 19, 2018, titled "Methods of Forming a Semiconductor Device, and Related Semiconductor Devices and Systems", to Chandolu et al., 34 pages.

*Primary Examiner* — Sonya McCall-Shepard
(74) *Attorney, Agent, or Firm* — TraskBritt

(57) ABSTRACT

A method of forming a semiconductor device comprises forming sacrificial structures and support pillars on a material. Tiers are formed over the sacrificial structures and support pillars and tier pillars and tier openings are formed to expose the sacrificial structures. One or more of the tier openings comprises a greater critical dimension than the other tier openings. The sacrificial structures are removed to form a cavity. A cell film is formed over sidewalls of the tier pillars, the cavity, and the one or more tier openings. A fill material is formed in the tier openings and adjacent to the cell film and a portion removed from the other tier openings to form recesses adjacent to an uppermost tier. Substantially all of the fill material is removed from the one or more tier openings. A doped polysilicon material is formed in the recesses and the one or more tier openings. A conductive material is formed in the recesses and in the one or more tier openings. An opening is formed in a slit region and a dielectric material is formed in the opening. Additional methods, semiconductor devices, and systems are disclosed.

18 Claims, 23 Drawing Sheets

(51) Int. Cl.
| | |
|---|---|
| *H01L 29/08* | (2006.01) |
| *H01L 27/11519* | (2017.01) |
| *H01L 27/11565* | (2017.01) |
| *H01L 27/11568* | (2017.01) |
| *H01L 27/11556* | (2017.01) |
| *H01L 21/02* | (2006.01) |
| *H01L 29/10* | (2006.01) |
| *H01L 29/66* | (2006.01) |
| *H01L 21/28* | (2006.01) |
| *H01L 29/45* | (2006.01) |
| *H01L 21/321* | (2006.01) |

(52) U.S. Cl.
CPC .. *H01L 21/02595* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/0847* (2013.01); *H01L 29/1037* (2013.01); *H01L 29/40114* (2019.08); *H01L 29/40117* (2019.08); *H01L 29/66545* (2013.01); *H01L 21/0217* (2013.01); *H01L 21/02164* (2013.01); *H01L 21/02576* (2013.01); *H01L 21/3212* (2013.01); *H01L 29/456* (2013.01); *H01L 29/665* (2013.01)

(58) Field of Classification Search
CPC ......... H01L 27/11551; H01L 27/11553; H01L 27/11556; H01L 27/1157; H01L 27/11578; H01L 27/1158; H01L 27/11582; H01L 27/11597; H01L 29/40117

See application file for complete search history.

(56) References Cited

U.S. PATENT DOCUMENTS

| | | | |
|---|---|---|---|
| 2011/0256718 | A1 | 10/2011 | Haukka et al. |
| 2015/0179660 | A1 | 6/2015 | Ogawa et al. |
| 2015/0255481 | A1* | 9/2015 | Baenninger ....... H01L 27/11575 |
| | | | 438/268 |
| 2016/0079250 | A1 | 3/2016 | Akutsu et al. |
| 2016/0163726 | A1 | 6/2016 | Tanzawa |
| 2016/0329343 | A1 | 11/2016 | Pachamuthu et al. |
| 2016/0351709 | A1 | 12/2016 | Nishikawa et al. |
| 2017/0011996 | A1 | 1/2017 | Lee et al. |
| 2017/0148800 | A1 | 5/2017 | Liu et al. |
| 2017/0148811 | A1 | 5/2017 | Zhang et al. |
| 2017/0200801 | A1 | 7/2017 | Hopkins et al. |
| 2017/0207226 | A1* | 7/2017 | Lee ....................... H01L 27/115 |
| 2017/0250193 | A1* | 8/2017 | Huo .................... H01L 21/3247 |
| 2017/0352704 | A1 | 12/2017 | Simsek-Ege |
| 2018/0108669 | A1 | 4/2018 | Zhu et al. |
| 2019/0067317 | A1* | 2/2019 | Shioda .............. H01L 29/40117 |

\* cited by examiner

ELECTRONIC DEVICES COMPRISING A SOURCE BELOW MEMORY CELLS AND RELATED SYSTEMS

CROSS-REFERENCE TO RELATED APPLICATION

This application is related to U.S. patent application Ser. No. 16/194,926, filed Nov. 19, 2018, now U.S. Pat. No. 10,566,241, issued on Feb. 18, 2020, entitled "METHODS OF FORMING A SEMICONDUCTOR DEVICE, AND RELATED SEMICONDUCTOR DEVICES AND SYSTEMS" and filed on even date herewith, and assigned to the Assignee of the present application, the entire disclosure of which is hereby incorporated herein in its entirety by this reference.

TECHNICAL FIELD

Embodiments disclosed herein relate to semiconductor devices and fabrication of the semiconductor devices. More particularly, embodiments of the disclosure relate to methods of forming a semiconductor device and to related memory devices and systems including the source.

BACKGROUND

Semiconductor device designers often desire to increase the level of integration or density of features within a semiconductor device by reducing the dimensions of the individual features and by reducing the distance between neighboring features. In addition, semiconductor device designers often desire to design architectures that are not only compact, but offer performance advantages, as well as simplified designs. A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes memory cell pillars extending through tiers of alternating conductive structures and insulative structures, with the conductive structures functioning as control gates. The memory cell pillars include a channel region positioned between a source region and a drain region. The configuration permits a greater number of electrical components (e.g., transistors) to be located in a unit of die area by building the array upwards (e.g., longitudinally, vertically) on a die, as compared to structures with conventional planar (e.g., two-dimensional) arrangements of electrical components.

To apply a potential to the memory device, a doped silicon wafer or an electrically conductive material above an interconnect is used as a source. To electrically connect the channel regions of the memory cells to the source, a so-called "pillar punch" etch process is conducted for each deck of tiers. A sacrificial polysilicon material is formed over a cell material to protect the cell material during the subsequently-conducted pillar punch etch process, which removes the sacrificial polysilicon material and underlying cell material at a bottom of the memory cell pillars. After conducting the pillar punch etch, the remaining sacrificial polysilicon material is removed, and channel material is formed over the cell material. In memory devices including multiple decks of tiers, a pillar punch etch process is conducted for each deck for proper alignment. However, as aspect ratios of the memory cell pillars continue to increase, alignment issues between the decks of tiers makes the pillar punch etch challenging.

DETAILED DESCRIPTION

Figure 1A:
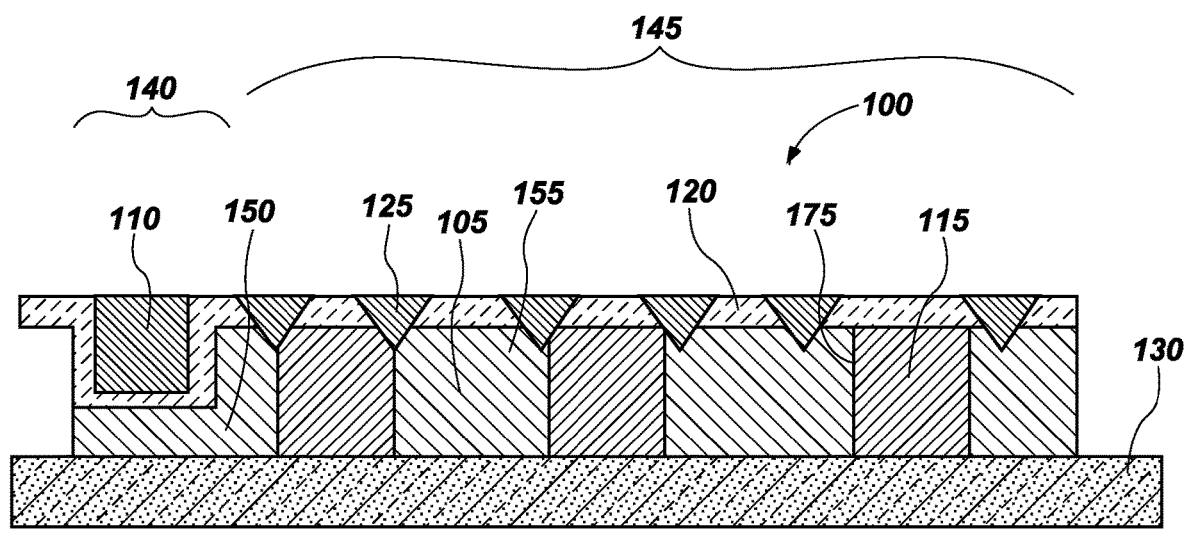
FIGS. 1A, 2A, 3A, 4A, 5A, 6A, 7A, 8A, 9A, 10A, and 11-15 are cross-sectional views showing various stages of fabrication of a source of a semiconductor device in accordance with embodiments of the disclosure.

A source of a semiconductor device, such as a memory device, is disclosed, as are methods of forming a semiconductor device containing the source and systems containing the source. The semiconductor device (e.g., a memory device) includes the source, a drain, cell films, and memory cells. The source formed according to embodiments of the disclosure is surrounded by the cell films (e.g., cell materials and channel materials) of memory cells of the semiconductor device, eliminating the necessity of conducting a pillar punch etch act to electrically connect the cell materials and channel materials of the memory cells to the source. The source is positioned below the memory cells and is in electrical contact with (e.g., electrically coupled to) the cell materials and channel materials of the memory cells. The methods according to embodiments of the disclosure are used to form three-dimensional (3D) semiconductor devices, such as 3D NAND Flash memory devices, which include, but are not limited to, 3D floating gate NAND Flash memory devices or 3D replacement gate NAND Flash memory devices. The source functions to apply a constant potential during use and operation of the 3D semiconductor device. In some embodiments, access to form the source is provided through large tier openings. In another embodiments, the source access is provided through contact openings. A critical dimension (CD) of the large tier openings or of the contact openings depends on the materials to be formed therein. Materials of the source are formed in desired locations by using the large tier openings or the contact openings to provide access. The source is formed through the large tier openings or through the contact openings before forming a slit opening through which a replacement gate process is conducted. The methods of forming the 3D semiconductor devices also enable substantially simultaneous dopant activation of the source and of the drain and substantially simultaneous formation of metallization in the source and in the drain. The metallization provides a conductive path to charge the source.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to the distance between identical points in two adjacent (i.e., neighboring) features.

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
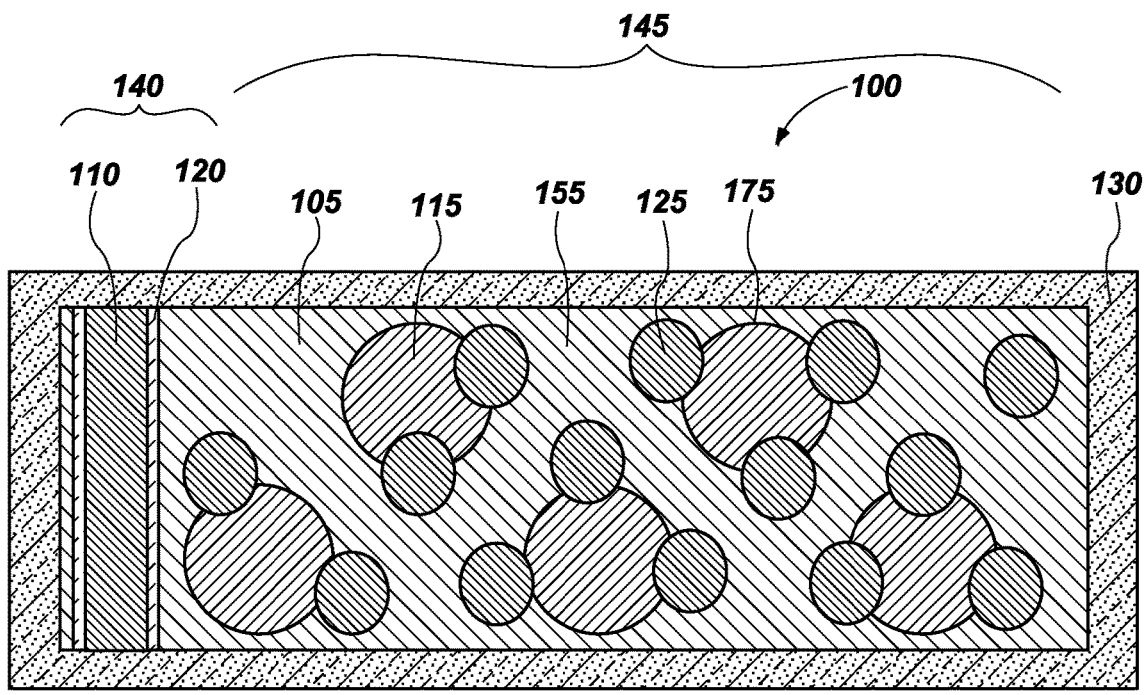
FIGS. 1B, 2B, 3B, 4B, 5B, 6B, 7B, 8B, 9B, and 10B are top down views showing various stages of fabrication of the source of the semiconductor device in accordance with embodiments of the disclosure.

A semiconductor structure 100 including connected sacrificial structures 105, isolated sacrificial structure 110, support pillars 115, oxide material 120, and optional sacrificial plugs 125 on an insulative material 130 are shown in FIGS. 1A and 1B. The insulative material 130 may be formed over an electrically conductive material (not shown) configured to, for example, route signals to and/or from the electrically conductive material, which in turn is formed on or over a substrate (not shown). The substrate may include multiple portions that support and/or isolate one or more other conductive materials and insulative materials for routing the signals to and/or from the electrically conductive material. For example, the substrate may include one or more conductive materials where circuitry (e.g., control units) and/or interconnections are provided for routing the signals. The locations of the connected sacrificial structures 105 substantially correspond to the location of source 135 (see FIGS. 8A, 8B, and 13) ultimately to be formed, as described below.

A sacrificial material is formed over the insulative material 130 by conventional techniques and patterned by conventional techniques to form the connected sacrificial structures 105 and the isolated sacrificial structure 110. As shown in the cross-sectional view, the connected sacrificial structures 105 are separated from one another by the support pillars 115, and the isolated sacrificial structure 110 is separated from the connected sacrificial structures 105 by the oxide material 120. As shown in the top down view, the connected sacrificial structures 105 are separated from the isolated sacrificial structure 110 by the oxide material 120. The isolated sacrificial structure 110 is formed in a slit region 140 of the semiconductor structure 100 and the connected sacrificial structures 105 are formed in a pillar region 145 of the semiconductor structure 100. The pillar region 145 includes tier pillars 160 and tier openings 170, into which cell films 165 are formed. The source 135 extends across the slit region 140 and the pillar region 145.

The sacrificial material of the sacrificial structures 105 is selected to function as an etch stop and to be selectively removable relative to a material of the support pillars 115 as described below. The sacrificial material is also available at a relatively low cost since the material is eventually removed (e.g., sacrificial). The sacrificial material may include, but is not limited to, a silicon oxide ($SiO_x$), a metal oxide, such as aluminum oxide ($AlO_x$), or a metal, such as tungsten (W). In some embodiments, the sacrificial material is aluminum oxide ($AlO_x$) or tungsten. The connected sacrificial structures 105 include a channel portion 150 and a pillar portion 155. The channel portion 150 of the connected sacrificial structures 105 is vertically adjacent to and extends under the isolated sacrificial structure 110.

The patterning of the sacrificial material forms openings (not shown), into which the support pillar material may be formed, producing the support pillars 115. The support pillar material is selected such that the support pillars 115 provide sufficient strength (e.g., mechanical strength) to support the overlying tier pillars 160 (see FIGS. 3A and 3B) in the pillar region 145 of the semiconductor structure 100 following removal of the connected sacrificial structures 105 at a subsequent processing stage. Dimensions of the support pillars 115 may depend on the number and size of the tier pillars 160 to be formed. The support pillars 115 are located in the pillar region 145 in sufficient number and size to support the tier pillars 160 without interfering with contact between a channel material of the cell films 165 (see FIGS. 4A and 4B) and the source 135. The support pillars 115 may be formed at a pitch that ranges from between two times and five times, or smaller, of the pitch of the tier openings (e.g., small tier openings 170A (see FIGS. 2A and 2B)). The support pillars 115 may be formed at a pitch sufficient to provide mechanical stability to the overlying tier pillars 160. The support pillar material may be a conductive material or an insulative material that is compatible with subsequent processing acts and remains following selective removal of the connected sacrificial structures 105. The support pillar material may include, but is not limited to, polysilicon or a silicon oxide, such as silicon dioxide. In some embodiments, the support pillar material is polysilicon.

A portion of the sacrificial material in the slit region 140 may be removed to form a recess (not shown). The oxide material 120 is conformally formed in the recess in the slit region 140 and over the connected sacrificial structures 105 and support pillars 115 in the pillar region 145. The oxide material 120 may, for example, be a $SiO_x$ material. A sacrificial material is formed in the recess in the slit region 140, producing the isolated sacrificial structure 110. The oxide material 120 substantially surrounds sidewalls and a bottom surface of the isolated sacrificial structure 110. The sacrificial material of the isolated sacrificial structure 110 may be selected to function as an etch stop. The sacrificial material may include, but is not limited to, a $SiO_x$, a metal oxide, such as $AlO_x$ or a metal, such as W, and may be selected to enable selective removal of nitride materials of tiers 180 (FIGS. 9A, 9B, and 14) during subsequent processing acts. The sacrificial material of the isolated sacrificial structure 110 may be the same as or different from the sacrificial material of the connected sacrificial structures 105. If different materials are used, the isolated sacrificial structure 110 and the connected sacrificial structures 105 may be selectively removable relative to one another. The isolated sacrificial structure 110 may also be selectively removable relative to the material of the support pillars 115.

Openings (not shown) are formed in the oxide material 120 proximal to interfaces 175 between the connected sacrificial structures 105 and the support pillars 115. The openings are formed at locations where the optional sacrificial plugs 125 are ultimately to be formed. An optional plug material is formed in the openings to form the sacrificial plugs 125 (e.g., pillar landing pads), as shown in FIGS. 1A and 1B. The sacrificial plugs 125, when present, provide critical dimension (CD) control to formation of the cell films 165 in the tier openings 170. If, however, sufficient CD control is achieved, the sacrificial plugs 125 may not be utilized. The plug material may include, but is not limited to, $AlO_x$, $AlO_x$ doped boron, W, a doped high-K material, such as aluminum- or hafnium-doped magnesium oxide, or a combination thereof. If the materials of the sacrificial plugs 125 and the isolated sacrificial structure 110 are the same, the sacrificial plugs 125 and isolated sacrificial structure 110 may be formed at substantially the same time. As described below, the formation of the sacrificial plugs 125 may help to provide pinch off at the bottom of the tier openings 170 during subsequent processing acts due to variation in CD of the tier openings 170 proximal to the connected sacrificial structures 105. The pinch off enables isolation in a channel transistor string that is formed (e.g., deposited) with ALD oxide from the source during formation of a fill material (e.g., fill material 200). While subsequent drawings show the oxide material 120 present in the slit region 140, the oxide material 120 and the sacrificial plugs 125 are omitted from the pillar region 145 for clarity.

Alternatively, the support pillar material is formed over the insulative material 130 and patterned to form the support pillars 115 and openings (not shown) between the support pillars 115 in the pillar region 145. The sacrificial material may be formed in the openings to form the connected sacrificial structures 105 separated from one another by the support pillars 115. In the slit region 140, the recess (not shown) may be formed before conformally forming the oxide material 120 in the recess and over the connected sacrificial structures 105 and support pillars 115 in the pillar region 145. The isolated sacrificial structure 110 and sacrificial plugs 125 may be formed as described above.

Figure 2A:
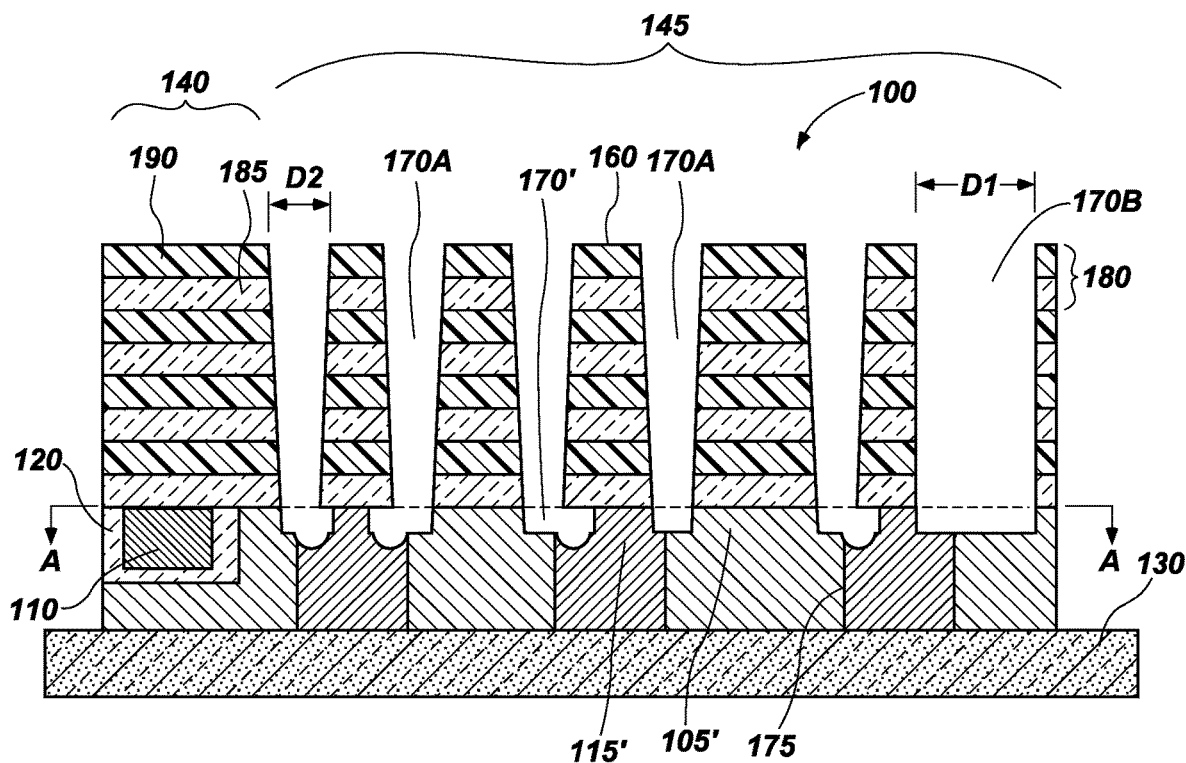
Figure 2B:
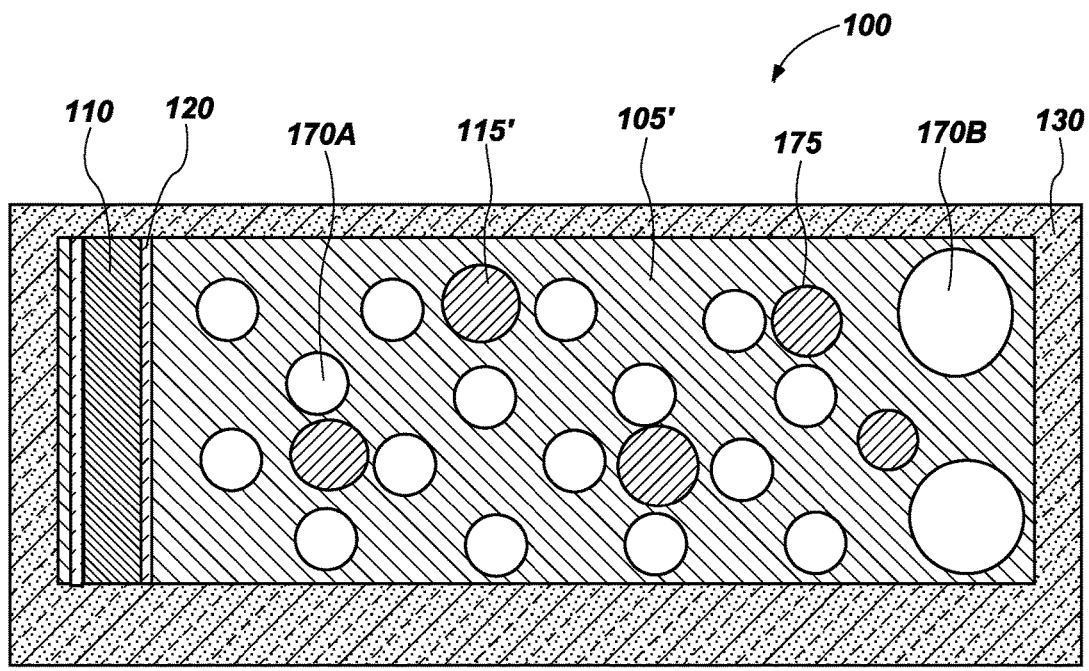

Tiers 180 of alternating dielectric materials 185 and nitride materials 190 are formed over the isolated sacrificial structure 110, the oxide material 120, the connected sacrificial structures 105, and the sacrificial plugs 125, if present, as shown in FIGS. 2A and 2B. The dielectric material 185 of the tiers 180 may include, but is not limited to, a silicon oxide ($SiO_x$), such as silicon dioxide ($SiO_2$), phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof. The nitride material 190 may include, but is not limited to, a silicon nitride (SiN). In some embodiments, the dielectric material 185 is $SiO_2$, and the nitride material 190 is SiN. The dielectric materials 185 and nitride materials 190 may be formed by conventional techniques. The nitride materials 190 are replaced with conductive materials during a subsequent processing act, such as a so-called "replacement gate" process.

The tiers 180 may be patterned to form the tier pillars 160 and the tier openings 170, which include small tier openings 170A (see FIG. 12) or small tier openings 170A and large tier openings 170B (see FIGS. 2A and 2B). For convenience, the term "tier openings" is used herein to refer collectively to the small tier openings 170A and the large tier openings 170B. The tier pillars 160 and the tier openings 170 may be formed by conventional techniques. In embodiments in which the source access is provided through the large tier openings 170B, the tier openings 170 include the small tier openings 170A and the large tier openings 170B. In embodiments in which the source access is provided through the contact openings, the tier openings 170 include the small tier openings 170A. If both small tier openings 170A and large tier openings 170B are present, the small tier openings 170A and the large tier openings 170B may be formed at the same time as one another or at different times. The large tier openings 170B or the contact openings provide access to form the source 135 below the tiers 180, while the cell films 165 of the memory cells are formed in the small tier openings 170A. In other words, materials of the source 135 are formed at desired locations, with the large tier openings 170B or of the contact openings providing access to the locations.

If only small tier openings 170A are present, a diameter of each of the small tier openings 170A may be substantially the same as one another or may differ from one another. The diameter of the small tier openings 170A may range from about 60 nm to about 120 nm, such as from about 60 nm to about 80 nm, from about 80 nm to about 100 nm, or from about 100 nm to about 120 nm. If both small tier openings 170A and large tier openings 170B are present, a diameter D1 of the large tier openings 170B is larger than a diameter D2 of the small tier openings 170A. The diameter of each of the large tier openings 170B may be substantially the same as one another or may differ from one another. The diameter of the large tier openings 170B may be sufficient to form the materials of the source 135 therein and to exhume (e.g., remove) the connected sacrificial structures 105' to form cavity 195. The desired diameter of the large tier openings 170B may be selected such that the materials of the source 135 are formed therein without substantially filling the large tier openings 170B. The diameter may, therefore, depend on a thickness at which the materials of the source 135 are formed. The diameter of each of the small tier openings 170A may be substantially the same as one another or may differ from one another. The diameter of the small tier openings 170A may range from about 60 nm to about 120 nm, such as from about 60 nm to about 80 nm, from about 80 nm to about 100 nm, or from about 100 nm to about 120 nm. Since the small tier openings 170A may be tapered in shape, the width proximal to the support pillars 115 and connected sacrificial structures 105 may be narrower than the width distal to the support pillars 115 and connected sacrificial structures 105.

To enable uniform doping of a channel material subsequently formed in the tier openings 170, the tier openings 170 are formed over the interfaces 175, such that a portion of both the support pillars 115 and the connected sacrificial structures 105 is exposed through the tier openings 170. In FIG. 2B, the dielectric materials 185 and nitride materials 190 of the tiers 180, the oxide material 120 in the pillar region 145, and the sacrificial plugs 125 have been removed for clarity. Therefore, the top down view in FIG. 2B illustrates the perspective along cross-section line A-A of FIG. 2A. The materials of the tiers 180 are removed to expose top surfaces of the connected sacrificial structures 105 and the support pillars 115, as shown by the dashed lines in FIG. 2A. The materials of the tiers 180 are removed by a first etch process, such as by a dry etch process.

A second etch process may then be conducted to remove exposed portions (e.g., partially remove) of the connected sacrificial structures 105 and the support pillars 115 adjacent to the interfaces 175, forming tier openings 170' and support pillars 115'. The tier openings 170' extend into the connected sacrificial structures 105 and the support pillars 115', with some of the tier openings 170' surrounded by the connected sacrificial structures 105, and other of the tier openings 170' surrounded by the connected sacrificial structures 105 and the support pillars 115'. The second etch process may, for example, be a wet etch process, and the materials removed to form connected sacrificial structures 105' and the support pillars 115'. Appropriate etch chemistries for removing the materials may be determined by a person of ordinary skill in the art. Since the tiers 180 remain over the isolated sacrificial structure 110, no portion of the isolated sacrificial structure 110 is removed at this fabrication stage. As described below, the resulting profile of the connected sacrificial structures 105' and support pillars 115' enables doping of the cell films 165 (see FIGS. 6A and 6B) subsequently formed in the tier openings 170' to provide a low resistance conductive path between the source 135 and a transistor of a select gate source. The profile of the connected sacrificial structures 105' and support pillars 115' includes shoulder regions.

While FIG. 2A illustrates a single deck of tiers 180, multiple decks of tiers 180 may be formed on top of one another and the decks of tiers 180 patterned as described above to form the tier pillars 160 and the tier openings 170 (170A, 170B). By way of example only, two or more aligned decks of tiers 180 may be formed on top of one another, such as three decks of tiers 180, four decks of tiers 180, or five or more decks of tiers 180. Therefore, conducting a pillar punch etch process is not needed even as dimensions of the tier openings 170 continue to be scaled down. The portions of the connected sacrificial structures 105 and the support pillars 115 may be removed as described above. As described below, a doped polysilicon material and a conductive material may subsequently be formed in the small and large tier openings 170A, 170B to form a transistor string of the memory cells of the semiconductor device.

Figure 3A:
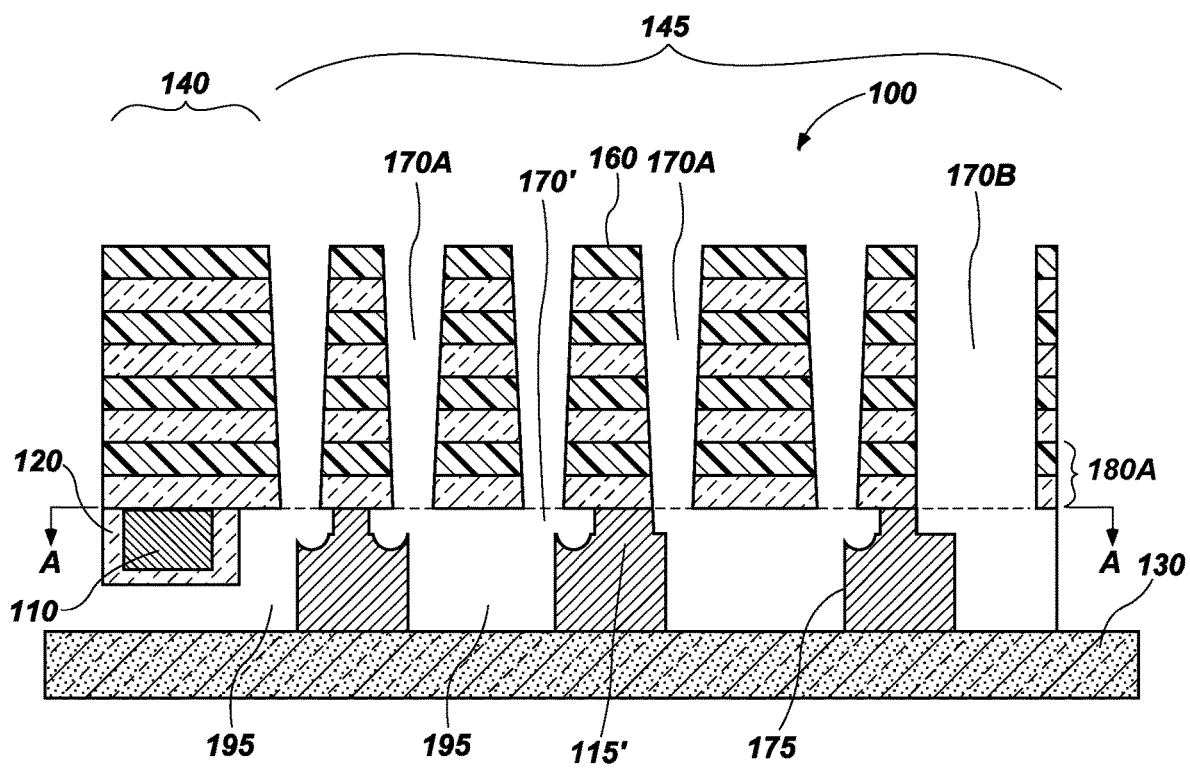
Figure 3B:
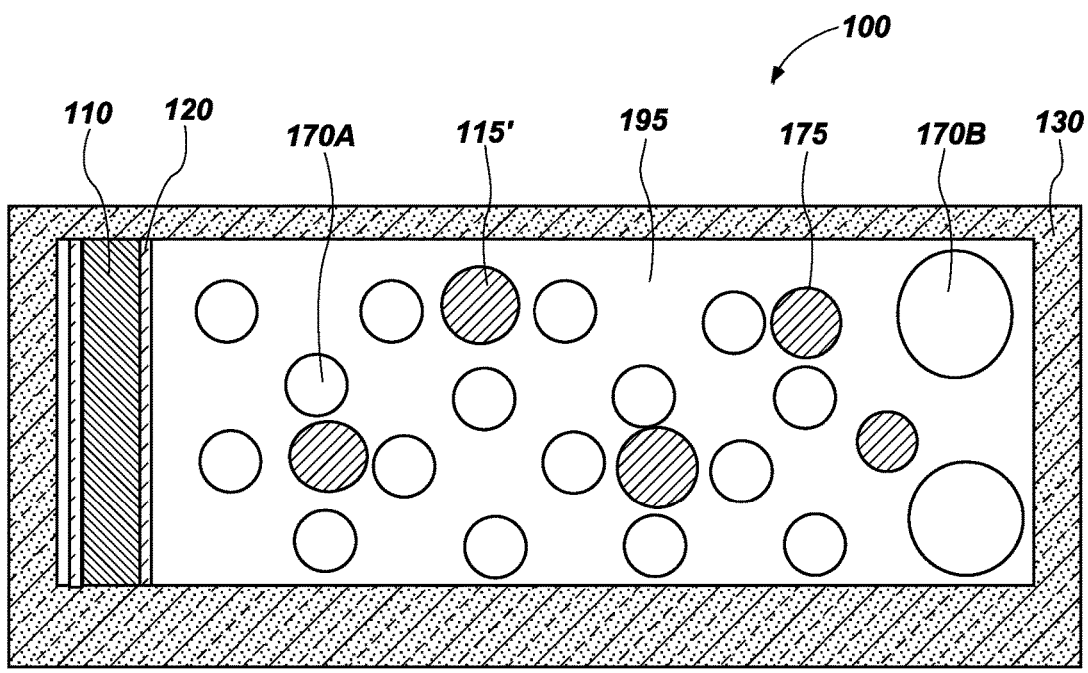

As shown in FIGS. 3A and 3B, the connected sacrificial structures 105' may be removed (e.g., exhumed) to form the cavity 195 in which the materials of the source are ultimately formed. Substantially all of the connected sacrificial structures 105' are removed from the pillar region 145, while the isolated sacrificial structure 110 in the slit region 140 remains protected by the tiers 180. The channel portion 150 of the connected sacrificial structures 105' is also removed, extending the cavity 195 under the isolated sacrificial structure 110. The cavity 195 is defined by surfaces of the support pillars 115', a bottom surface of the lowermost tier 180A, and an upper surface of the insulative material 130. The connected sacrificial structures 105' may be removed by an etch chemistry that selectively removes the sacrificial material without removing the pillar support material. The connected sacrificial structures 105' are removed, for example, by a wet etch process. Following the removal of the connected sacrificial structures 105', a portion of the cavity 195 is located below the pillar region 145, including below the large tier openings 170B, while another portion of the cavity 195 extends below the isolated sacrificial structure 110 in the slit region 140. The support pillars 115' remaining in the pillar region 145 provide sufficient mechanical stability and integrity to support the tier pillars 160 after removal of the connected sacrificial structures 105'. In FIG. 3B, the dielectric materials 185 and nitride materials 190 of the tiers 180, the oxide material 120 in the pillar region 145, and the sacrificial plugs 125 have been removed for clarity. Therefore, the top down view in FIG. 3B illustrates the perspective along cross-section line A-A of FIG. 3A.

Dimensions of the cavity 195 may be sufficient to contain a conductive material that functions as the source 135 of the semiconductor structure 100. The dimensions of the cavity 195 may be determined by resistance requirements of the source 135 and are scalable by adjusting (e.g., increasing, decreasing) a height (e.g., a thickness) at which the connected sacrificial structures 105 and the support pillars 115 are initially formed. By way of example only, the sacrificial material and the support pillar material may be formed at a thickness of from about 2000 Å to about 2500 Å. As described below, the source 135 may be substantially completely filled with the conductive material to achieve the desired resistance requirements.

Figure 4A:
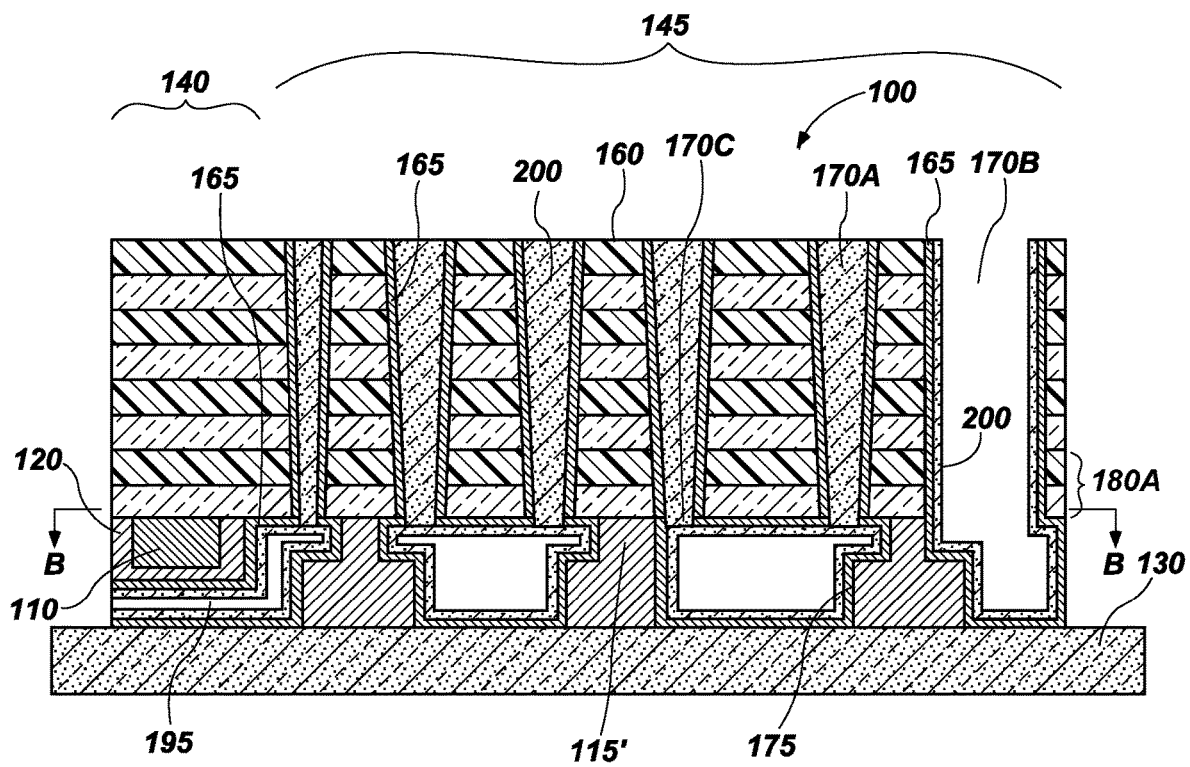
Figure 4B:
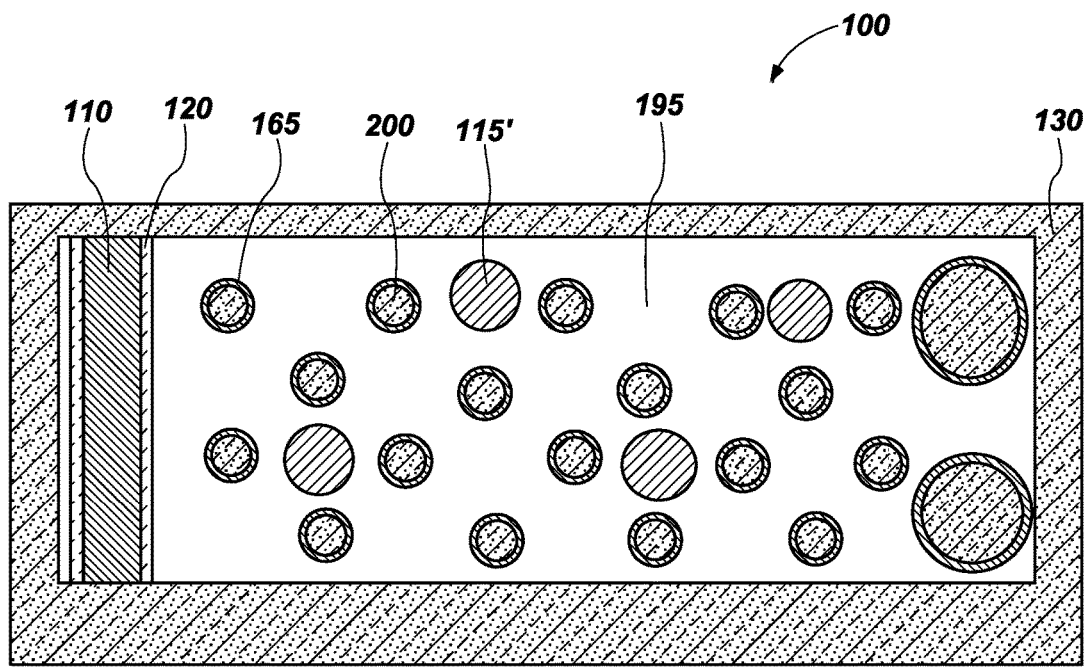

The cell film 165 is formed in the tier openings 170 (170A, 170B) and in the cavity 195, as shown in FIGS. 4A and 4B, such as over the exposed surfaces of the support pillars 115', the bottom surface of the lowermost tier 180A, and the upper surface of the insulative material 130. The cell film 165 is formed as a continuous material and functions as a conductor in locations where $N^+$ doping diffuses into the channel material from an adjacent doped polysilicon material, such as in the source and drain. The cell film 165 may also be formed over horizontal surfaces (not shown) of an uppermost tier (not shown) of the tiers 180. The cell film 165 may include a cell material formed within the tier openings 170, and a channel material formed over the cell material. For convenience, the cell material and the channel material are illustrated as a single material (e.g., the cell film 165) in FIGS. 4A and 4B. However, the cell film 165 is understood to include both the cell material and the channel material. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the tier pillars 160 and over surfaces of the cavity 195 in the slit region 140 and in the pillar region 145. The cell material may be formed at a smaller relative thickness than the channel material. The channel material may be conformally formed over the cell material. The channel material may, for example, be polysilicon.

As the formation of the channel material in the small and large tier openings 170A, 170B and cavity 195 progresses, a portion of the small tier openings 170A proximal to the cavity 195 may become substantially completely filled, forming so-called "pinched off" portions 170C above the cavity 195. The sacrificial plugs 125 (see FIGS. 1A and 1B), when present, positioned proximal to the cavity 195 also contribute to the pinching-off within the small tier openings 170A. The amount (e.g., thickness) of the cell materials and channel material in the cavity 195 before the small tier openings 170A becomes pinched off may be sufficient to provide electrical contact between the cell films 165 and source 135. In the large tier openings 170B, the cell film 165 is formed on sidewalls of the dielectric materials 185 and of the nitride materials 190 of the tiers 180 and on exposed surfaces of the support pillars 115' and the upper surface of the insulative material 130.

A fill material 200 may be formed over the channel material, substantially filling the small tier openings 170A and conformally forming over the cell films 165 in the large tier openings 170B. The fill material 200 in the small tier openings 170A and 170B is surrounded by the cell material and the channel material of the cell film 165. The fill material 200 is an insulative material, such as a high quality silicon oxide material. For example, the fill material 200 may be a highly uniform and highly conformal silicon oxide material (e.g., a highly uniform and highly conformal silicon dioxide material). The fill material 200 may be highly uniform and highly conformal as deposited. The fill material 200 may be formed by conventional techniques, such as by ALD. In some embodiments, the fill material 200 is an ALD $SiO_x$. The fill material 200 may initially be formed in the tier openings 170 (170A, 170B) and over exposed horizontal surfaces of the cell film 165, with the fill material 200 over the horizontal surfaces of the cell film 165 subsequently removed, such as by an abrasive planarization process (e.g., chemical mechanical planarization (CMP)). If the small tier openings 170A are pinched off by the cell film 165 proximal to the cavity 195, substantially no fill material 200 may form in the cavity 195 through the small tier openings 170A. However, the fill material 200 may form in the cavity 195 through the large tier openings 170B. If the fill material 200 is present in the cavity 195, the fill material 200 may be removed before completing formation of the source 135.

The fill material 200 only partially fills the large tier openings 170B, as shown in FIG. 4A, providing continued access to the cavity 195 to form the additional materials of the source 135 therein. In FIG. 4B, the dielectric materials 185 and nitride materials 190 of the tiers 180, the oxide material 120 in the pillar region 145, and the sacrificial plugs 125 have been removed for clarity. However, the fill material 200 and the cell film 165 are illustrated. Therefore, the top down view in FIG. 4B illustrates the perspective along cross-section line A-A of FIG. 4A.

Figure 5A:
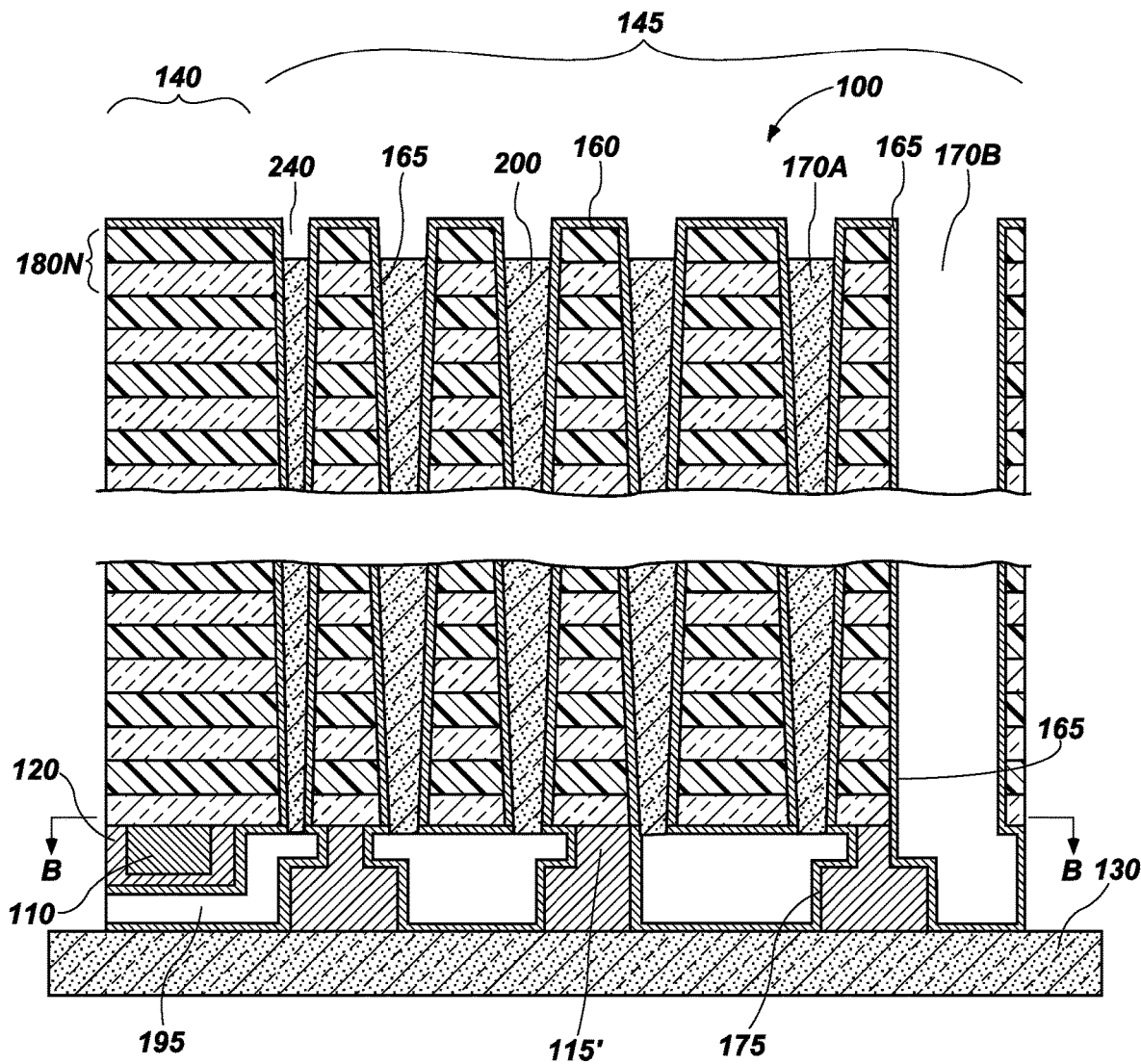
Figure 5B:
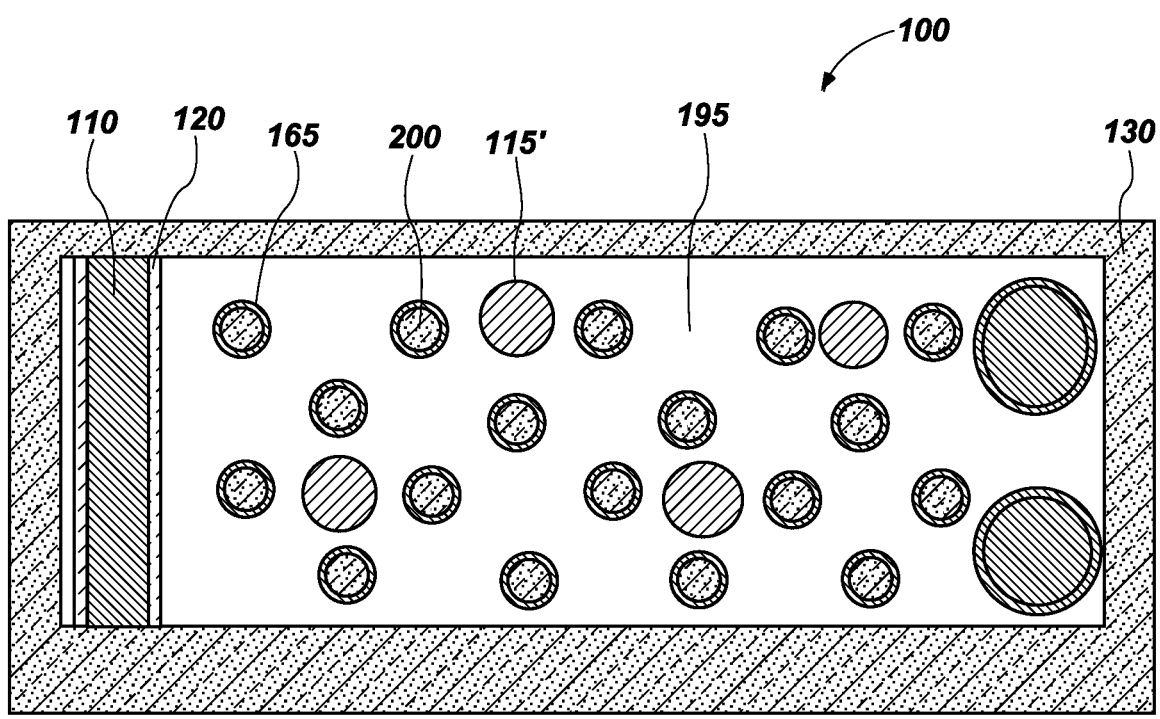

A portion of the fill material 200 is removed from the small tier openings 170A and substantially all of the fill material 200 is removed from the large tier openings 170B and from the cavity 195, as shown in FIGS. 5A and 5B. The fill material 200 removed from the small tier openings 170A may form recesses 240 distal to the cavity 195, as shown in FIG. 5A. The cell film 165 may, therefore, be exposed adjacent to an uppermost tier 180N of tiers 180. As shown in FIG. 5A, the fill material 200 proximal to the cavity 195 may remain in the small tier openings 170A while the fill material 200 in the large tier openings 170B and in the cavity 195 is substantially removed. The portion of the fill material 200 in the small tier openings 170A and substantially all of the fill material 200 in the large tier openings 170B may be removed, forming the recesses 240 adjacent to the uppermost tier 180N of the tiers 180. In other words, the fill material 200 is partially removed from locations in the small tier openings 170A distal to the cavity 195 and laterally adjacent to the uppermost tier 180N of the tier pillars 160. The fill material 200 may be removed by a conventional etch process, such as by a vapor etch process, that removes the fill material 200 from the large tier openings 170B and the cavity 195 while recessing the fill material 200 in the openings 170A adjacent to the uppermost tier 180N. Suitable etch chemistries and etch conditions may be determined by a person of ordinary skill in the art. A wet etch process may also be used to remove desired portions of the fill material 200. The locations of the recesses 240 correspond to locations of drains 255 (see FIG. 8A) ultimately to be formed in the semiconductor structure 100. Dimensions of the recesses 240 may be selected depending on the desired configuration of the drains 255. In FIG. 5B, the dielectric materials 185 and nitride materials 190 of the tiers 180, the oxide material 120 in the pillar region 145, and the sacrificial plugs 125 have been removed for clarity. However, the cell film 165 is illustrated. Therefore, the top down view in FIG. 5B illustrates the perspective along cross-section line A-A of FIG. 5A.

Figure 6A:
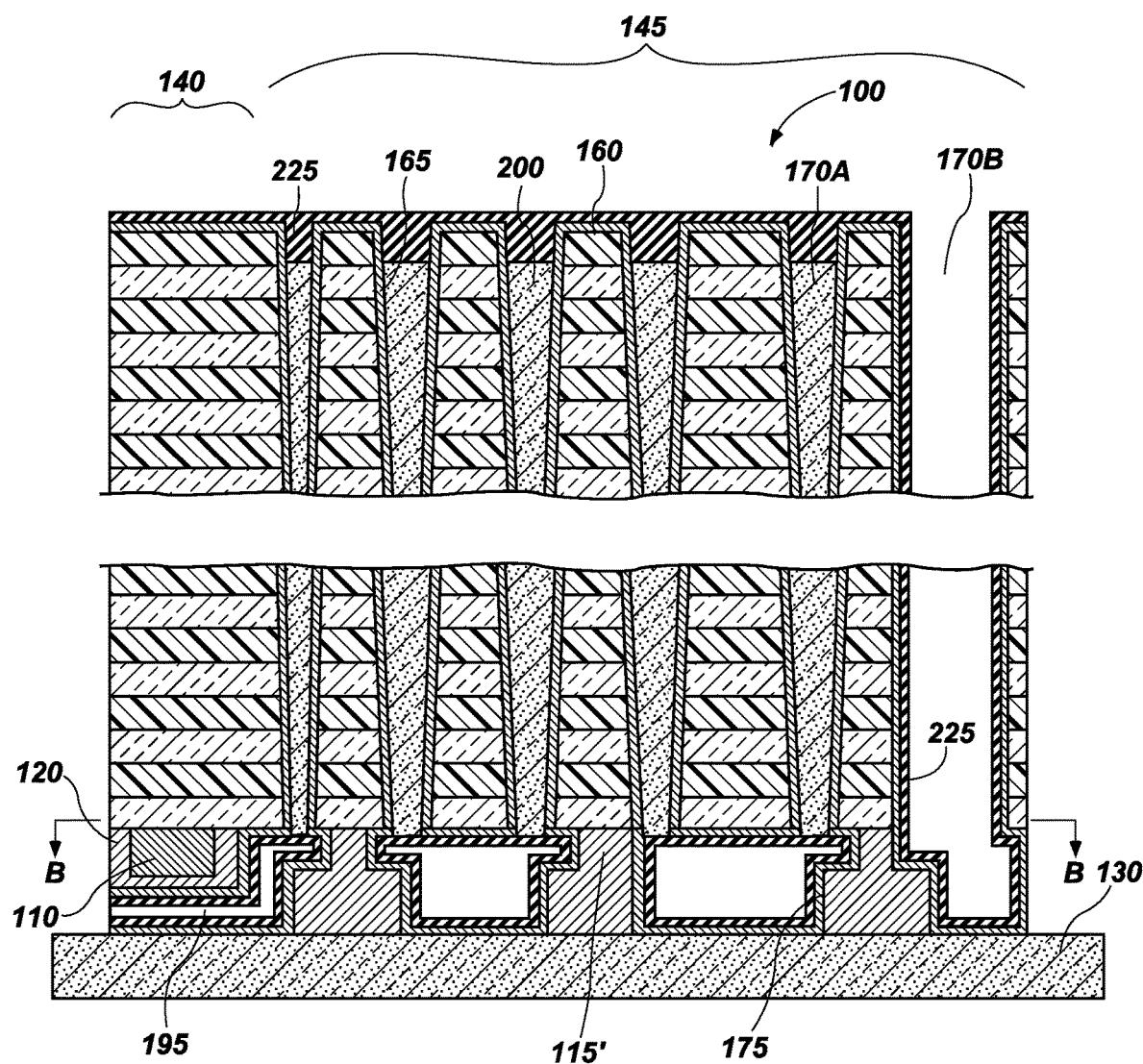
Figure 6B:
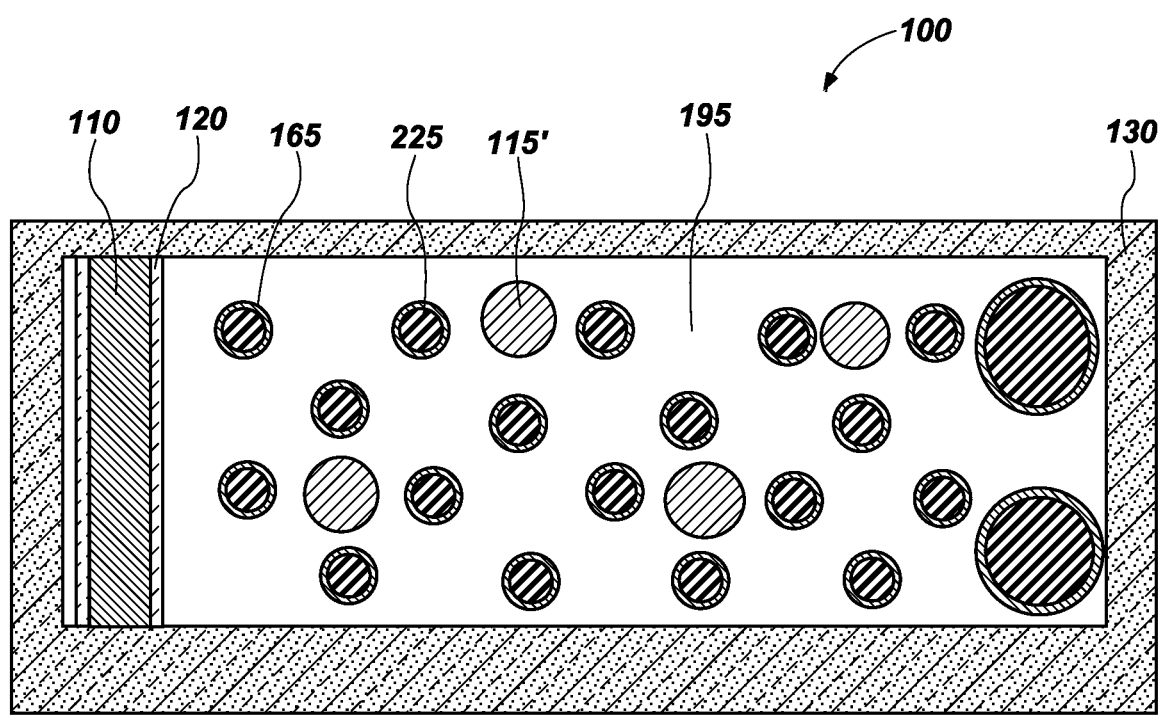

As shown in FIGS. 6A and 6B, a doped polysilicon material 225 is formed in the recesses 240 and over the cell film 165 in the large tier openings 170B and in the cavity 195. The doped polysilicon material 225 may be conformally formed over the cell film 165 in the large tier openings 170B and in the cavity 195, as shown in FIG. 6A, with a portion of the cavity 195 and the large tier openings 170B remaining unfilled. The initial diameter of the large tier openings 170B may be selected such that the formation of the cell film 165 and the doped polysilicon material 225 in the large tier openings 170B does not substantially fill the large tier openings 170B. Therefore, access to the cavity 195 through the large tier openings 170B is maintained even after forming the doped polysilicon material 225. The doped polysilicon material 225 may substantially fill the recesses 240, as shown in FIG. 6A. The doped polysilicon material 225 may, for example, include n+ doped polysilicon. The doped polysilicon material 225 may be conformally formed over the channel material of the cell films 165 in the cavity 195 and in the large tier openings 170B. By forming the doped polysilicon material 225 in the recesses 240 and in the cavity 195 in a single act, the source 135 and drains 255 of the semiconductor structure 100 may be formed substantially simultaneously, reducing the number of and complexity of acts utilized to form the source 135 and drains 255.

The doped polysilicon material 225 may exhibit a substantially uniform dopant concentration along its length or the dopant concentration in the doped polysilicon material 225 may vary at different locations. By way of example only, the doped polysilicon material 225 may include different dopant concentrations in the source 135 and drains 255. For instance, the doped polysilicon material 225 in the recesses 240 may include a higher dopant concentration than the doped polysilicon material 225 in the source 135. To increase the dopant concentration, additional dopant may be implanted into the drains 255 after forming the doped polysilicon material 225 in the recesses 240. The dopant concentration of the doped polysilicon material 225 may be initially selected and formed at a desired dopant concentration for the source 135 and the additional dopant may be implanted into the drains 255 to increase the dopant concentration.

If the doped polysilicon material 225 exhibits a substantially uniform dopant concentration along its length, the doped polysilicon material 225 may enable uniform doping of the cell film 165 in the large tier openings 170B and in the cavity 195 during use and operation of the semiconductor structure 100. The dopant may diffuse from the source 135 and up the channel portion of the cell films 165, forming n+ doped regions. Since the cell film 165 is formed in the small tier openings 170A above the interfaces 175, the doping profile of the cell film 165 in each of the small tier openings 170A may be substantially the same as one another as the dopant diffuses from the doped polysilicon material 225 and into the cell film 165 during use and operation of the semiconductor structure 100. The dopant diffuses from the doped polysilicon material 225 and toward the cell film 165 to provide the desired low resistance conductive path between the source 135 and the transistor of the select gate source.

Figure 7A:
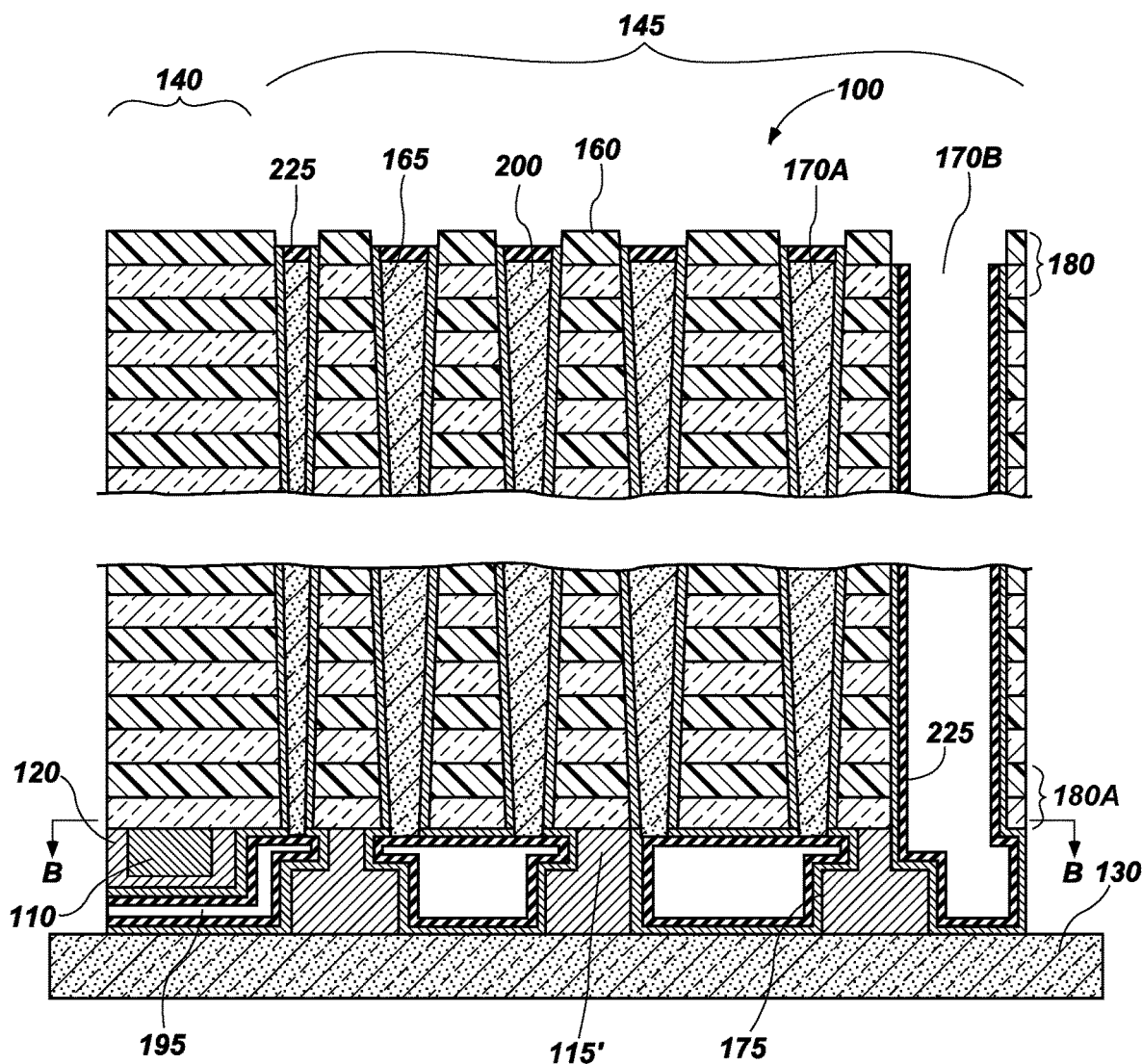
Figure 7B:
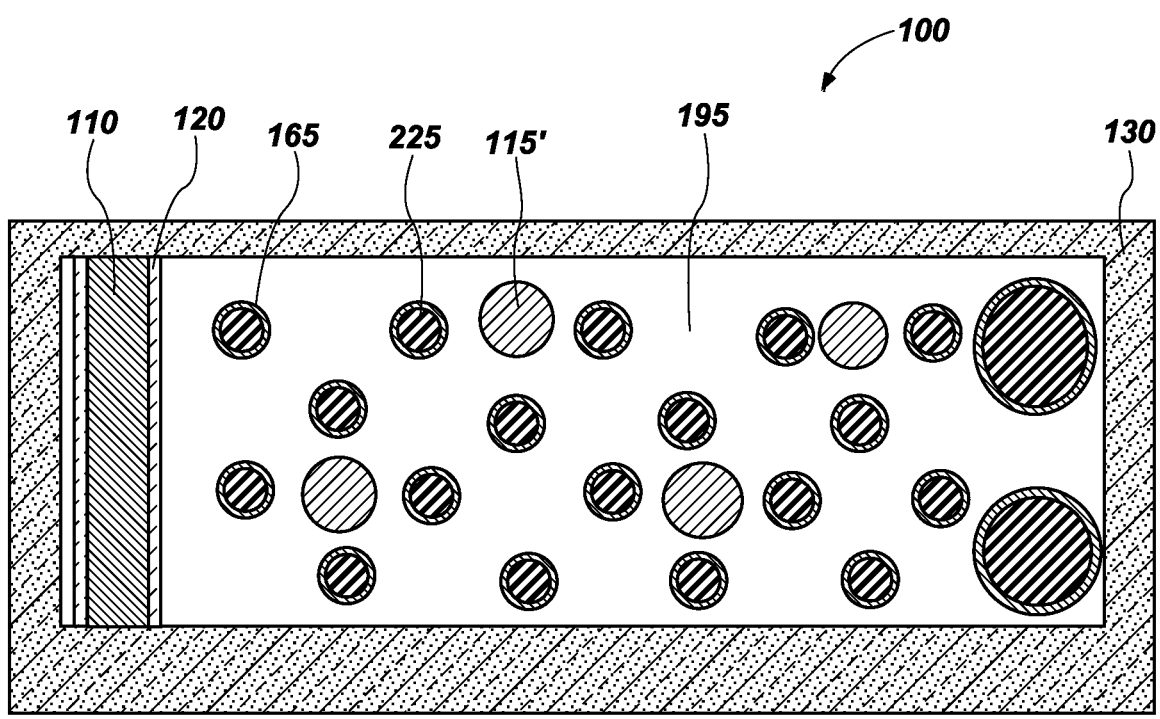

Excess doped polysilicon material 225 may be removed from the uppermost tier 180N, and a portion of the doped polysilicon material 225 in the recesses 240 and in the large tier openings 170B removed, as shown in FIGS. 7A and 7B. The cell film 165 over the horizontal surfaces of the uppermost tier 180N may also be removed. The portion of the doped polysilicon material 225 may be removed from the uppermost tier 180N by, for example, abrasive planarization (e.g., chemical-mechanical planarization). The doped polysilicon material 225 in the large tier openings 170B may be surrounded by the cell film 165. The recesses 240 include the doped polysilicon material 225 and laterally adjacent portions of the cell film 165. Relative dimensions of the doped polysilicon material 225 and a conductive material 230, described below, in the recesses 240 may be selected depending on the desired configuration of the drains 255.

Figure 8A:
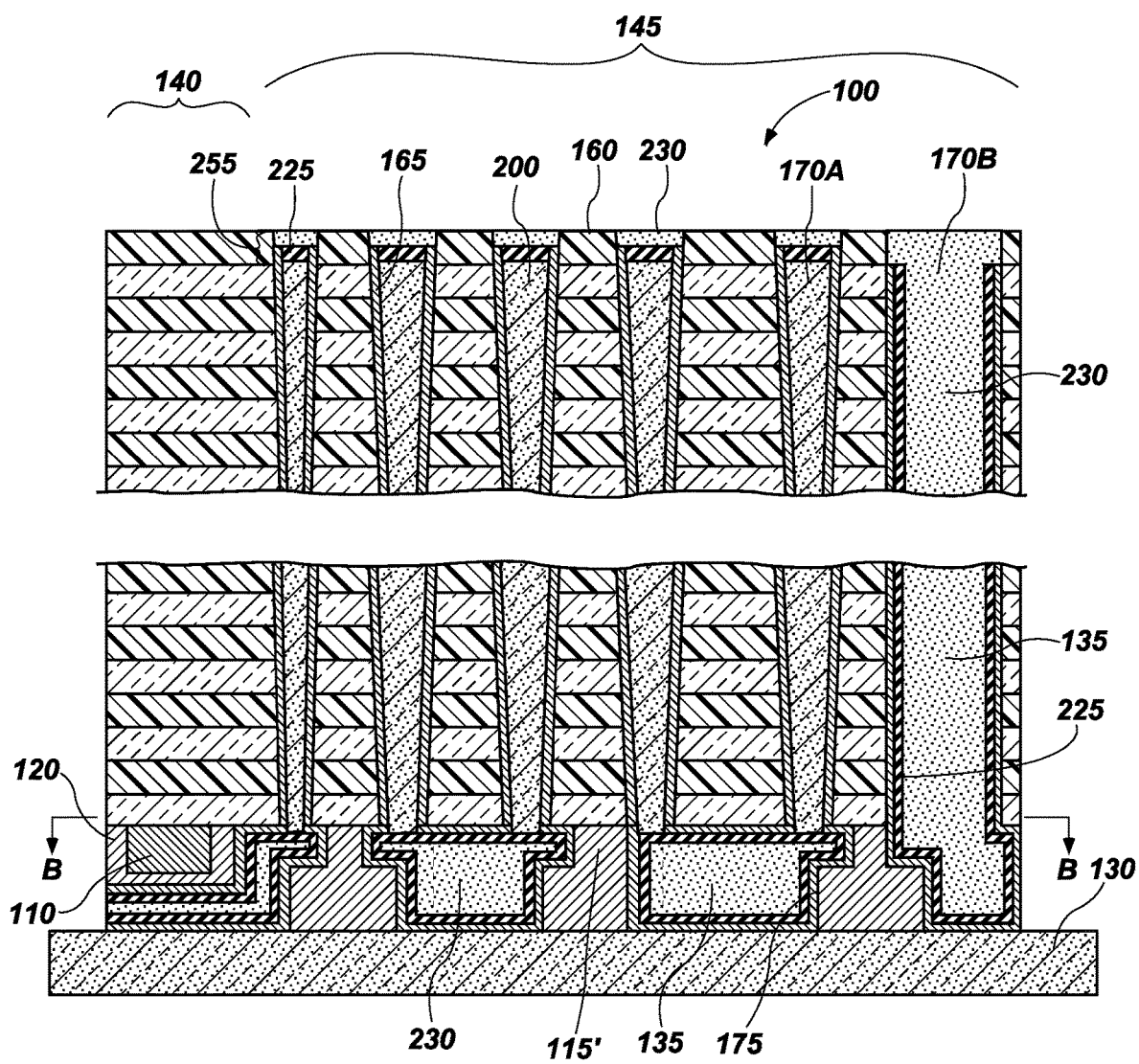
Figure 8B:
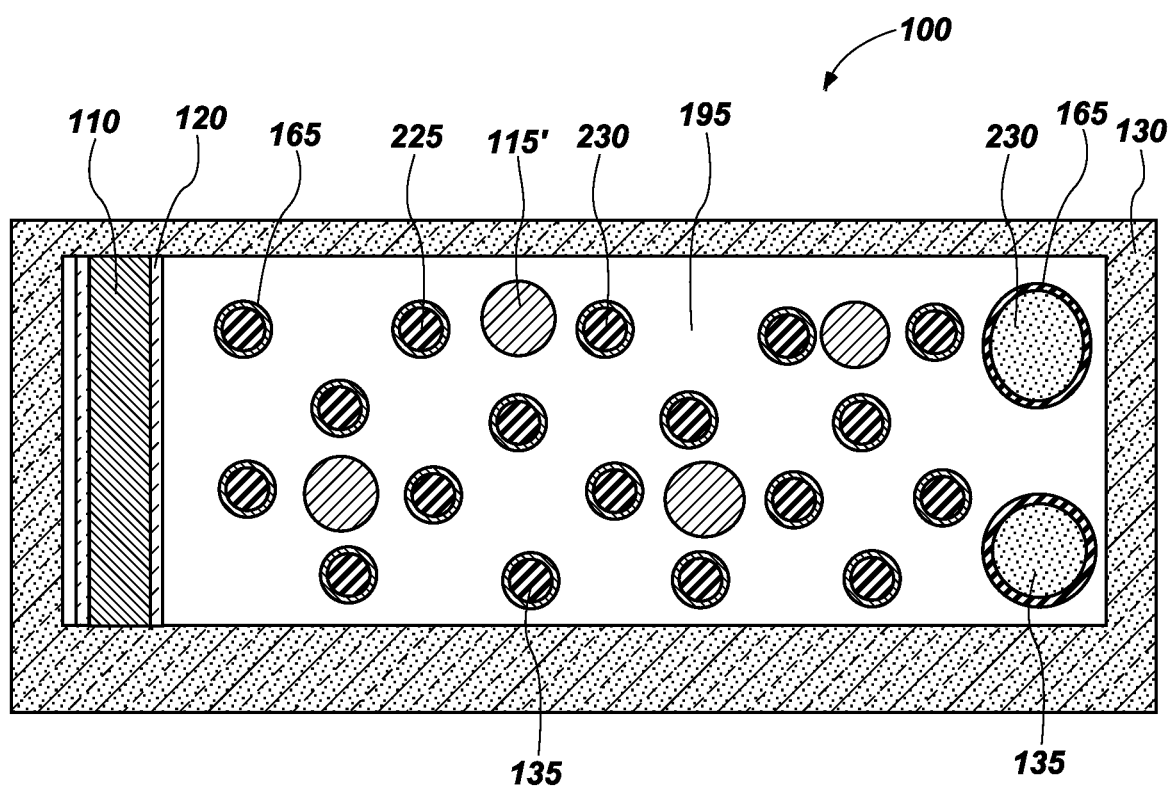

The remainder of the recesses 240, the cavity 195, and the large tier openings 170B may be filled with the conductive material 230 as shown in FIGS. 8A and 8B. The conductive material 230 and the doped polysilicon material 225 in the cavity 195 forms the source 135, and the conductive material 230 and the doped polysilicon material 225 in the recesses 240 forms the drains 255. The conductive material 230 and the doped polysilicon material 225 between the source 135 and the drains 255 electrically connect the source 135 and the drains 255 to the channel of the transistor string. FIG. 8A illustrates one possible configuration of the drains 255 and includes the conductive material 230 over (e.g., vertically adjacent to) the doped polysilicon material 225. However, other drain configurations are possible. The conductive material 230 substantially completely fill the recesses 240, the cavity 195, and the large tier openings 170B. In other words, the recesses 240, the cavity 195, and the large tier openings 170B may be substantially free of voids (e.g., air gaps) following the formation of the conductive material 230. The conductive material 230 may include, but is not limited to, a metal-containing material, polysilicon, or other conventional material. The conductive material 230 may include, but is not limited to, a tungsten-containing material, a titanium-containing material, or a combination thereof. The conductive material 230 may, for example, include a silicided metal material, such as a silicided tungsten ($WSi_x$) material. In some embodiments, the conductive material 230 is tungsten. In other embodiments, the conductive material 230 is $WSi_x$. Any conductive material 230 formed over the uppermost tier 180N of the tiers 180 in the pillar region 145 and in the slit region 140 may be removed, such as by CMP, to isolate connections to the source 135.

While the conductive material 230 is illustrated in FIGS. 8A and 8B as being a single material, a person of ordinary skill in the art would understand that the metal-containing material may also include a liner material, such as titanium nitride (TiN), tungsten nitride (WN), or a combination (e.g., a laminate) of titanium and TiN, under the metal-containing material. For example, titanium may be formed over the doped polysilicon material 225, followed by forming titanium nitride over the titanium. The tungsten may then be formed over the titanium nitride.

Figure 9A:
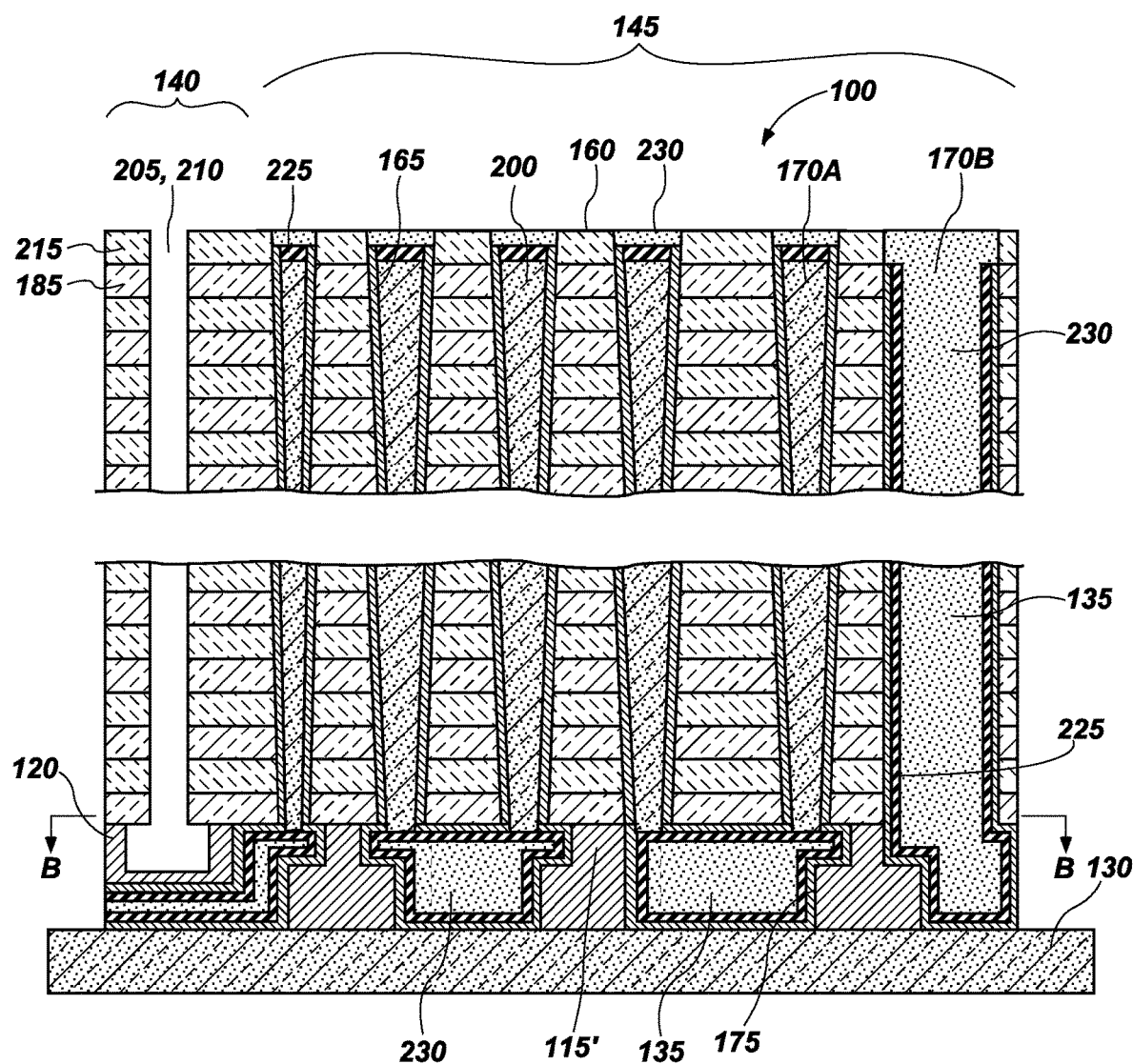
Figure 9B:
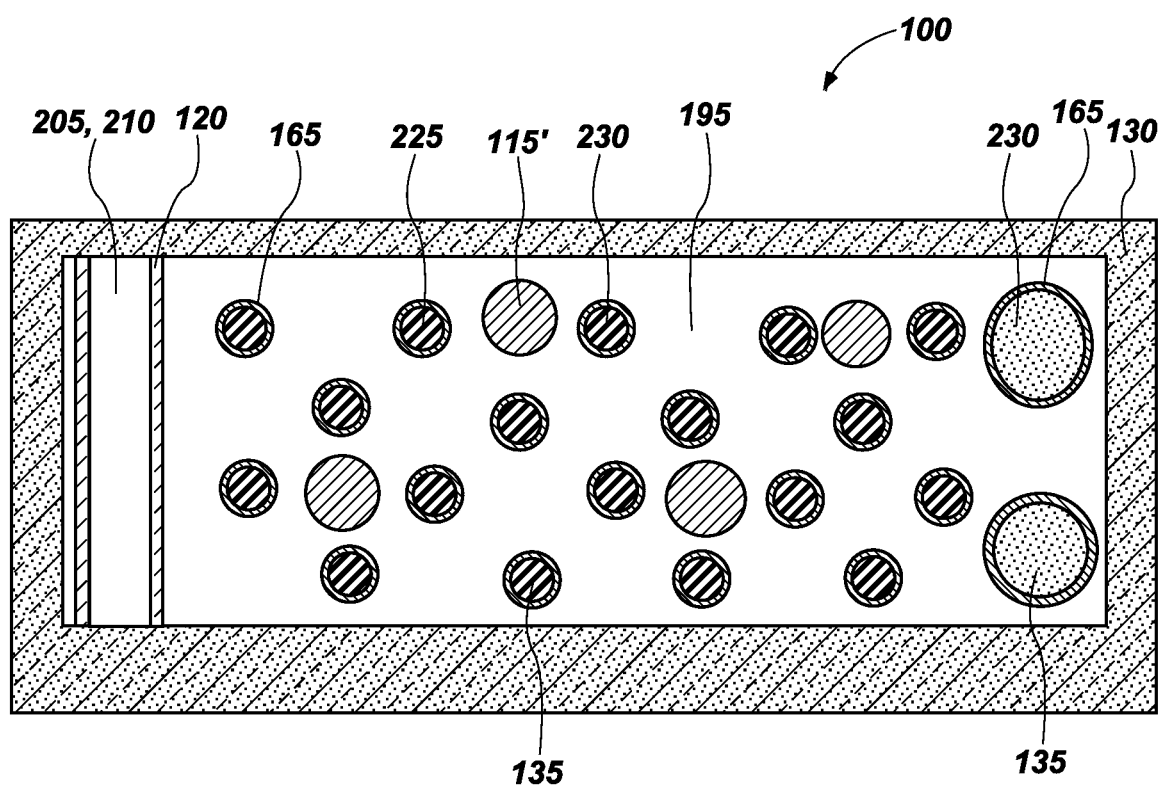

A slit 205 is formed in the slit region 140 by removing a portion of the tiers 180 overlying the isolated sacrificial structure 110, as shown in FIG. 9A. The portion of the dielectric materials 185 and nitride materials 190 of the tiers 180 is removed to expose a top surface of the isolated sacrificial structure 110, as shown by the dashed line in FIG. 9A. The isolated sacrificial structure 110, therefore, functions as an etch stop. The slit 205 is formed by conventional techniques. Before forming the slit 205, an oxide material (not shown) may be formed over the drains 255 to provide protection from an etch chemistry and etch conditions utilized in the slit 205 formation. The isolated sacrificial structure 110 is then selectively removed, exposing sidewalls and a bottom horizontal surface of the oxide material 120 and extending the slit 205 to form slit opening 210. The isolated sacrificial structure 110 is removed by conventional techniques.

The nitride materials 190 of the tiers 180 are then selectively removed and conductive materials 215 formed in the resulting spaces. The removal of the nitride materials 190 and replacement with the conductive materials 215 is conducted by a so-called "replacement gate" process. The nitride materials 190 may be removed, such as by a wet etch process (e.g., an isotropic etch process), that utilizes an etch chemistry selective for the nitride materials 190 relative to the dielectric materials 185 of the tiers 180 and the oxide material 120. Therefore, the large tier openings 170B are utilized in embodiments of the disclosure to form the source 135 while the slit 205 is utilized to form the conductive materials 215 of the tiers 180 using the replacement gate process. Some of the resulting conductive materials 215 of the tiers 180 correspond to word lines (e.g., access lines) of the memory cells and other of the conductive materials 215 of the tiers 180 correspond to select gate sources/select gate drains of the memory cells. While one slit opening 210 is shown in FIG. 9A, an additional slit(s) may be present for between every additional four tier openings 170 and nine tier openings 170 in the tiers 180.

The conductive materials 215 may be a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or a combination thereof. The conductive materials 215 may be formed by conventional techniques. In some embodiments, the conductive materials 215 are polysilicon.

Figure 10A:
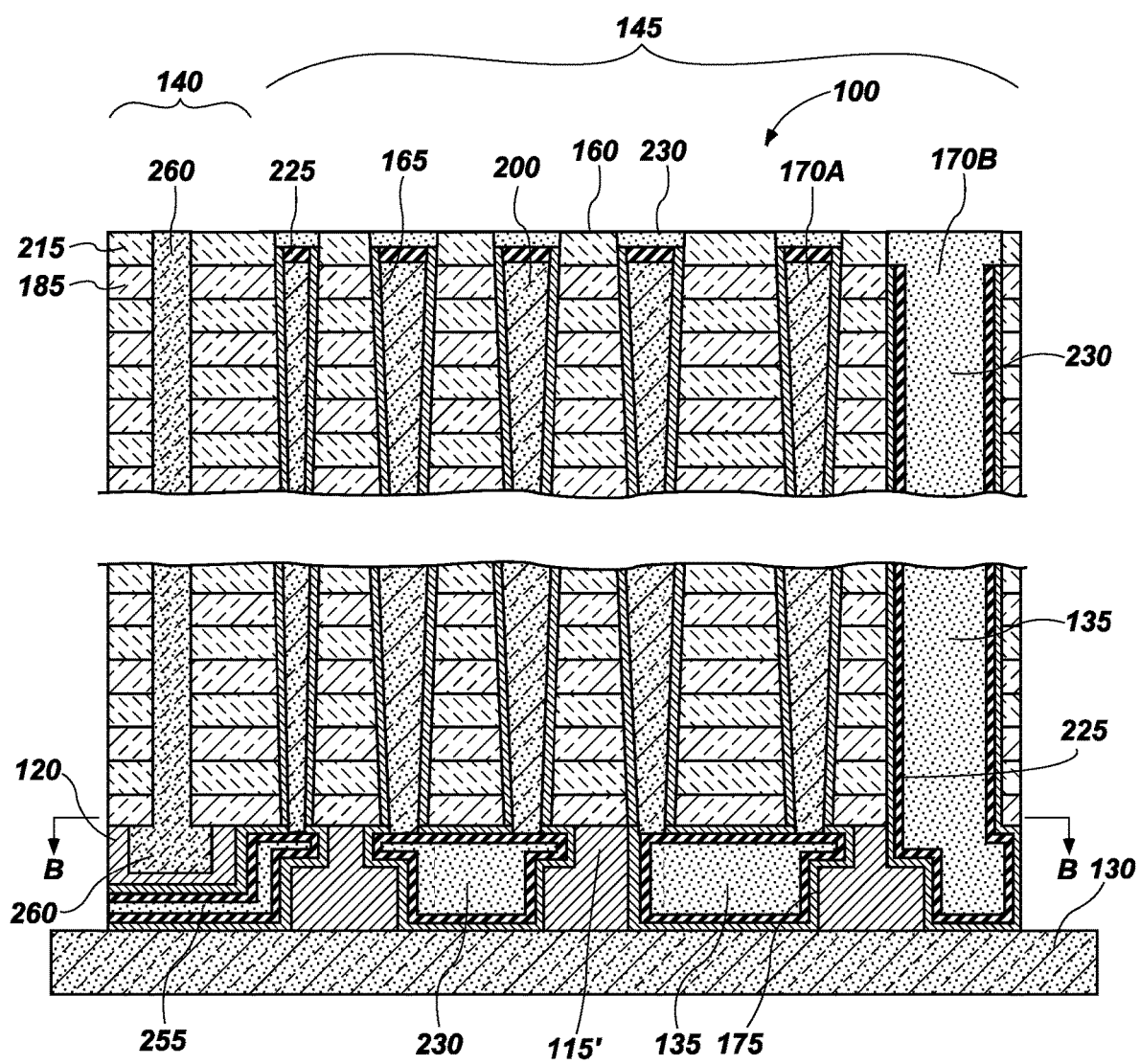
Figure 10B:
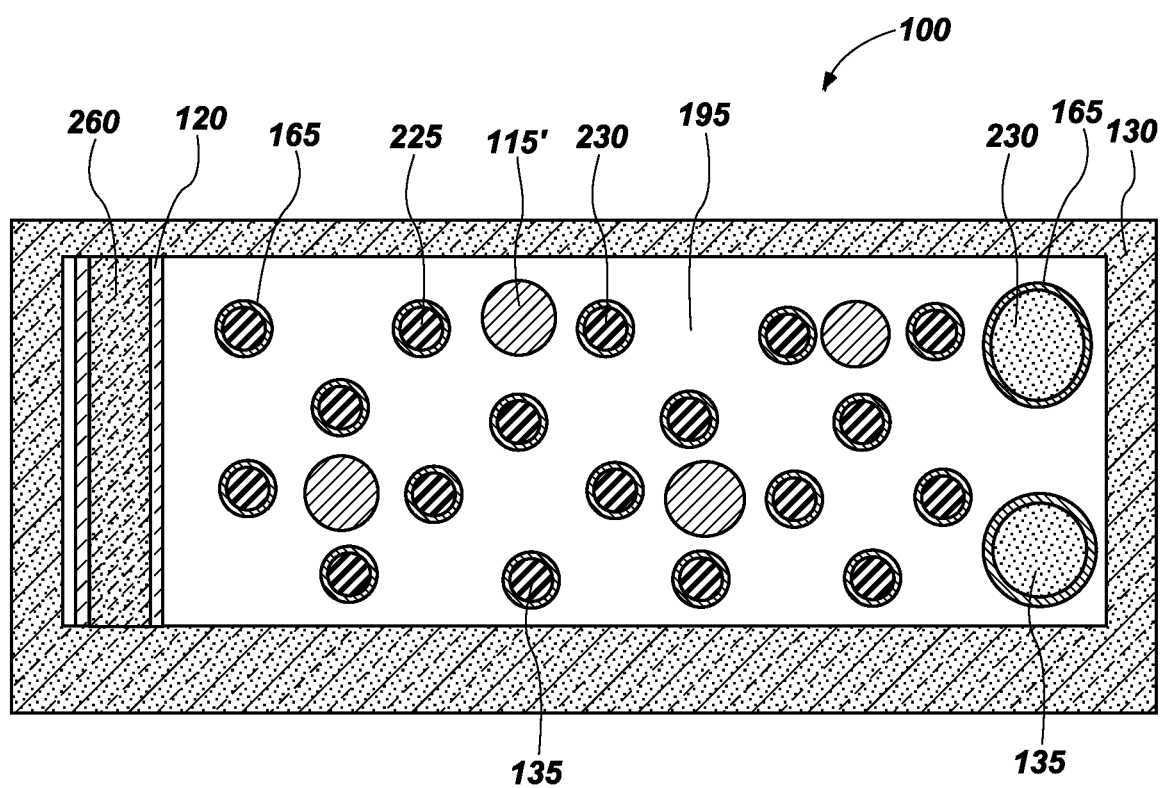

The slit 205 and slit opening 210 may then be filled with a slit dielectric material 260, as shown in FIGS. 10A and 10B. The slit dielectric material 260 may include, but is not limited to, a silicon oxide ($SiO_x$), an air gap, or combinations thereof. The slit dielectric material 260 may protect the dielectric materials 185 and conductive materials 215 adjacent to the slit 205 and slit opening 210 from cracking or other damage.

Figure 11:
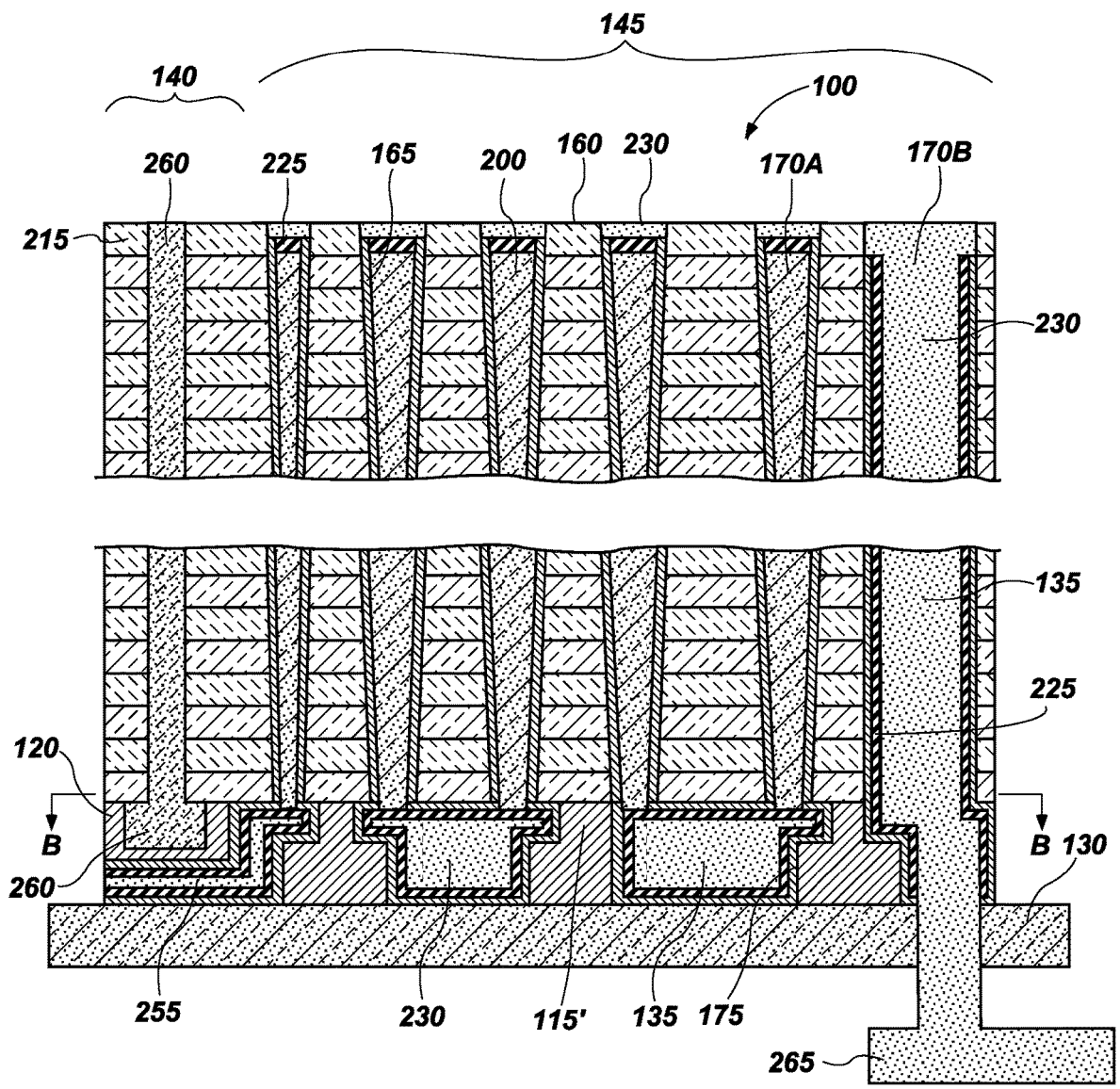

Power to the source 135 may be provided through the electrically conductive material configured to, for example, route signals to and/or from the electrically conductive material, which in turn is formed on or over the substrate (not shown). The electrically conductive material may be located above the source 135 or below the source 135 and may be in electrical communication with the source 135. By way of example only, the electrically conductive material may be configured as a interconnect 265 located below the source 135, as shown in FIG. 11. To form the interconnect 265, the cell film 165 and the doped polysilicon material 225 may be removed from bottom surfaces of the large tier openings 170B and the large tier openings 170B extended through the insulative material 130 before forming the conductive material 230 in the large tier openings 170B. After extending the large tier openings 170B, the conductive material 230 is formed in the extended large tier openings 170B so that the conductive material 230 of the source 135 is in electrical contact with the interconnect 265 as shown in FIG. 11. The conductive material 230 provides electrical communication between the source 135 and the interconnect 265, providing power from the interconnect 265 to charge the source 135. While FIG. 11 illustrates the interconnect 265 as being below the source 135, the interconnect 265 may be located above the source 135.

By utilizing the large tier openings 170B having larger dimensions than the small tier openings 170A to provide access, the cell film 165, the doped polysilicon material 225, and the conductive material 230 of the source 135 may be easily formed and electrically connected to the interconnect 265. The large tier openings 170B also enable the connected sacrificial structures 105' to be easily removed (e.g., exhumed) to form the cavity 195 in which the materials of the source 135 are formed. Utilizing the large tier openings 170B in the formation of the source 135 also enables substantially simultaneous dopant activation of the source 135 and of the drains 255 and substantially simultaneous formation of metallization in the source 135 and the drains 255.

Accordingly, a method of forming a semiconductor device is disclosed. The method comprises forming sacrificial structures and support pillars on a material, the sacrificial structures extending between a pillar region and a slit region. Tiers are formed over the sacrificial structures and support pillars and a portion of the tiers in the pillar region is removed to form tier pillars and tier openings and to expose the sacrificial structures and the support pillars. One or more of the tier openings comprises a greater critical dimension than the other tier openings. The sacrificial structures are removed to form a cavity, the cavity comprising interconnected portions and a portion of the cavity in the slit region and a portion of the cavity in the pillar region. A cell film is formed over sidewalls of the tier pillars, over sidewalls of the cavity, and over sidewalls of the one or more of the tier openings comprising the greater critical dimension. A fill material is formed in the tier openings and adjacent to the cell film. A portion of the fill material is removed from the other tier openings to form recesses adjacent to an uppermost tier and substantially all of the fill material is removed from the one or more of the tier openings comprising the greater critical dimension. A doped polysilicon material is formed in the recesses and in the one or more of the tier openings comprising the greater critical dimension. A conductive material is formed adjacent to the doped polysilicon material in the recesses and in the one or more of the tier openings comprising the greater critical dimension. An opening is formed in the slit region and a dielectric material is formed in the opening.

Figure 12:
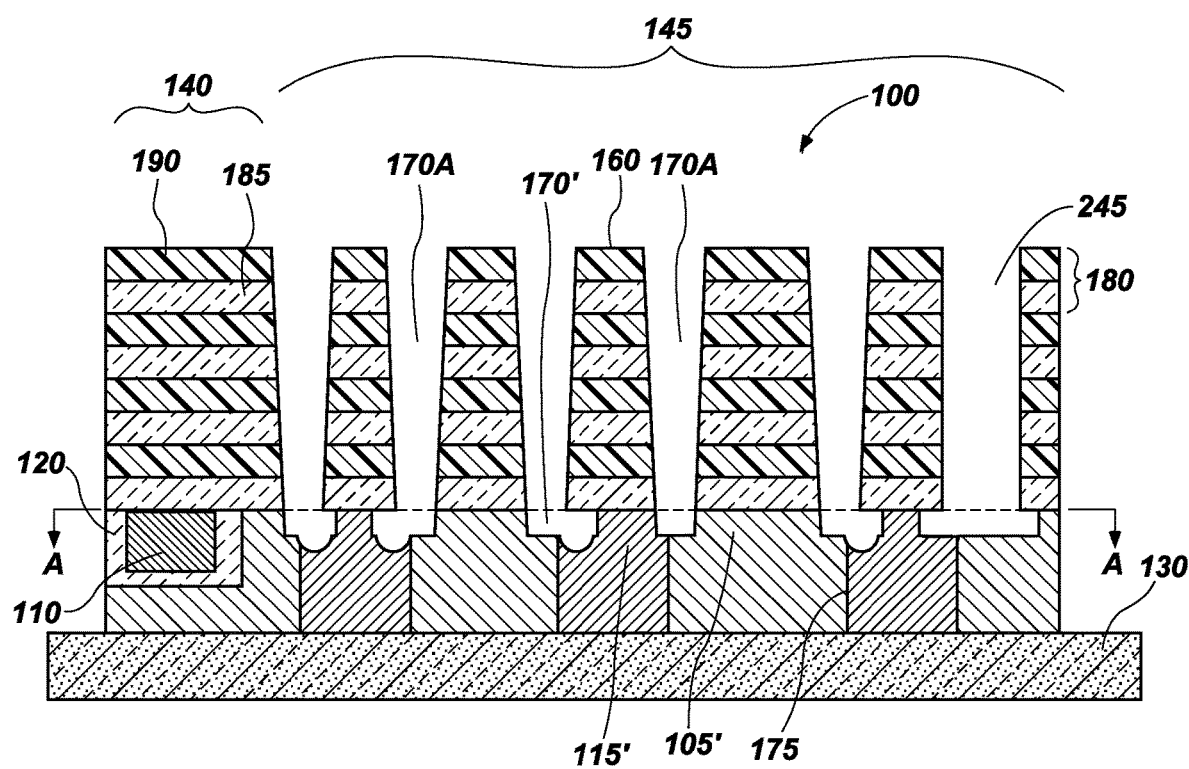

In another embodiment, access for forming the source 135 is provided through contact openings 245, as shown in FIG. 12. While FIG. 12 illustrates both the small tier openings 170A and the contact openings 245, the small tier openings 170A and the contact openings 245 may be formed at different stages, with the contact openings 245 formed after the cell film 165 and the fill material 200 are formed in the small tier openings 170A. The small tier openings 170A are formed through the tiers 180 and at desired locations as described above in relation to FIGS. 2A and 2B. The contact openings 245 are formed at a desired location and through the tiers 180. The contact openings 245 may extend from a top surface of the semiconductor structure 100 to a top surface of the connected sacrificial structures 105 and the support pillars 115, as indicated in FIG. 12 by the dashed line. To prevent the contact openings 245 from extending into the connected sacrificial structures 105 and the support pillars 115, an etch chemistry and etch conditions may be selected to prevent removal of the materials or an etch stop material (not shown) may be formed below the contact openings 245. The etch stop material may, for example, be formed at the same time and from the same materials as the isolated sacrificial structure 110 and the oxide material 120. Portions of the connected sacrificial structures 105 and the support pillars 115 are removed from the small tier openings 170A, as described above in relation to FIGS. 2A and 2B, extending the small tier openings 170A and forming the connected sacrificial structures 105' and the support pillars 115' below the small tier openings 170A. The connected sacrificial structures 105' are removed, as described above in relation to FIGS. 3A and 3B, to form the cavity 195 underlying the small tier openings 170A.

Figure 13:
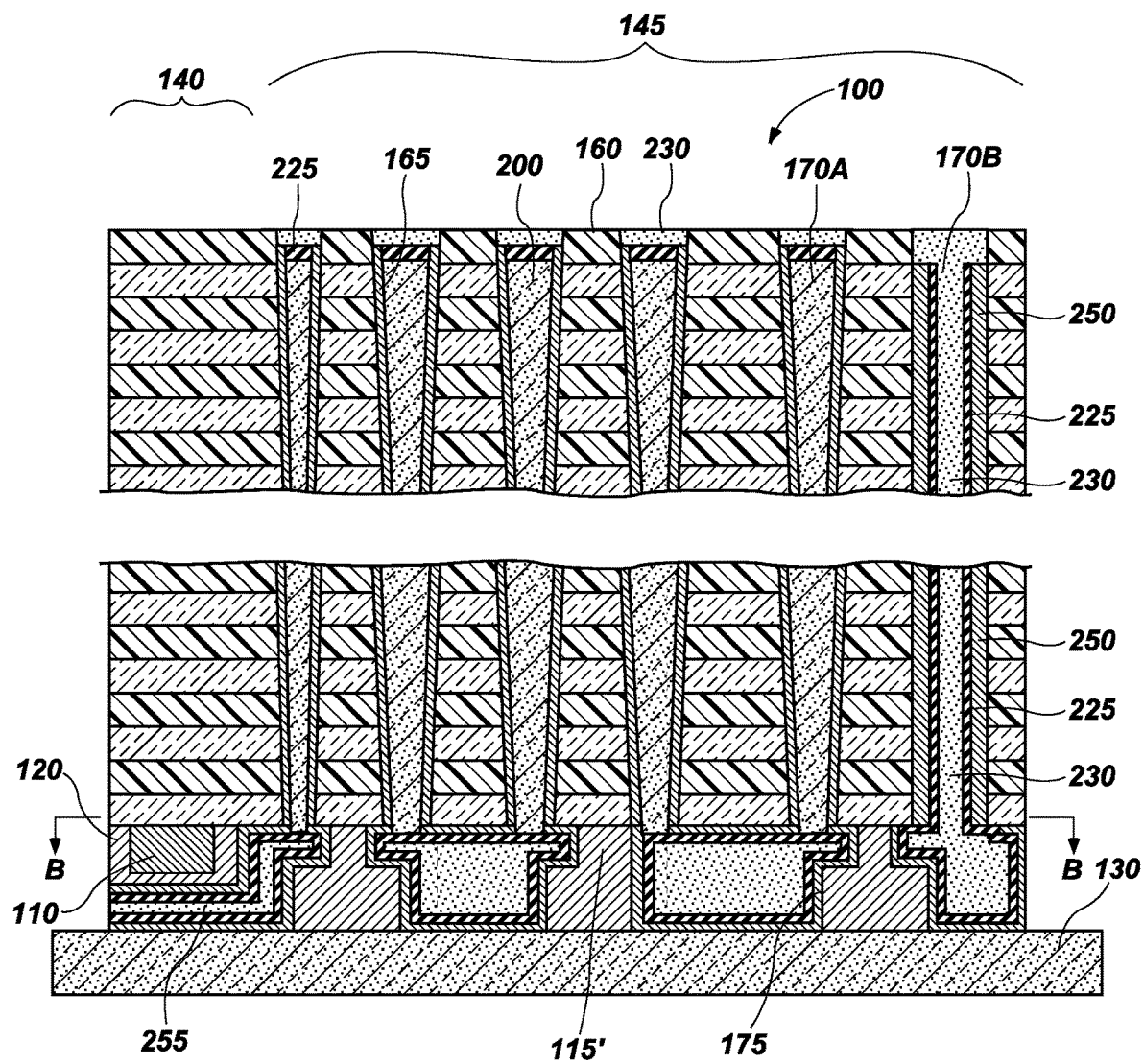

As shown in FIGS. 12 and 13, the cell film 165 and the fill material 200 may be formed in the small tier openings 170A and in the portion of the cavity 195 underlying the small tier openings 170A as described above in relation to FIGS. 4A and 4B. The cell film 165 may be conformally formed in the small tier openings 170A and in the cavity 195. The fill material 200 may be formed over the cell film 165, substantially filling the small tier openings 170A. Therefore, the fill material 200 in the small tier openings 170A is surrounded by the cell material and the channel material of the cell film 165. If the small tier openings 170A are pinched off by the cell film 165 proximal to the cavity 195, substantially no fill material 200 may enter the cavity 195 below the small tier openings 170A. If, however, the fill material 200 is present in the cavity 195, the fill material 200 may be removed from the cavity 195, as described above in relation to FIGS. 4A and 4B, before conducting additional process acts to complete the source 135.

The contact openings 245 are formed through the tiers 180 at desired locations and contact the underlying connected sacrificial structures 105 and the support pillars 115. The contact openings 245 may be formed after forming the cell film 165 and the fill material 200 in the small tier openings 170A and forming the cell film 165 in the cavity 195 below the small tier openings 170A. After removing the etch stop material from the bottom of the contact openings 245, a portion of the connected sacrificial structures 105 and the support pillars 115 is subsequently removed to form the connected sacrificial structures 105' and the support pillars 115', as described above in relation to FIGS. 2A and 2B, below the contact openings 245. In other words, the contact openings 245 extend through the tiers 180 and expose underlying top surfaces of the etch stop material, which is overlying the connected sacrificial structures 105 and the support pillars 115. The etch stop material is removed by conventional techniques and an exposed portion of the connected sacrificial structures 105 and the support pillars 115 is removed to form the connected sacrificial structures 105' and the support pillars 115'. The connected sacrificial structures 105' are then removed, as described above in relation to FIGS. 3A and 3B, forming the cavity 195 under the contact openings 245, which is connected to the cavity 195 underlying the small tier openings 170A. The cavity 195, therefore, includes interconnected portions under the small tier openings 170A and the contact openings 245. The contact openings 245 may be formed by conventional techniques. A diameter of the contact openings 245 may be sufficient to subsequently form desired materials in the contact openings 245. Therefore, the contact openings 245 provide access to the cavity 195 to form additional materials of the source 135 therein. For example, the diameter of the contact openings 245 may be substantially similar to the diameter of the small tier openings 170A or may be greater than the diameter of the small tier openings 170A. While FIGS. 12 and 13 illustrate the small tier openings 170A and the contact openings 245 as being formed at the same time and having various materials formed therein, the disclosure is not limited thereto.

An oxide spacer 250 is formed over sidewalls of the dielectric materials 185 and nitride materials 190 in the contact openings, as shown in FIG. 13. After forming the oxide spacer 250, the oxide material 120 and the cell film 165 at the bottom of the contact openings 245 are removed (e.g., etched), providing access from the contact openings 245 to the source 135. The doped polysilicon material 225 is formed over the oxide spacer 250 in the contact openings 245 and over the cell film 165 in the cavity 195 underlying the contact openings 245 and the small tier openings 170A, as described above in relation to FIGS. 6A and 6B. The remainder of the contact openings 245 and the cavity 195 may be filled with the conductive material 230, as shown in FIG. 13, and as described above in relation to FIGS. 8A and 8B. The doped polysilicon material 225 and the conductive material 230 may also be formed in the recesses 240 as described above in relation to FIGS. 6A, 6B, 7A, 7B, 8A, and 8B, to form the drains 255. The conductive material 230 may include one or more of the materials described above. For instance, titanium may be formed over the doped polysilicon material 225, followed by forming titanium nitride over the titanium. Tungsten may then be formed over the titanium nitride. Any conductive material 230 formed over the uppermost tier 180N of the tiers 180 in the pillar region 145 and in the slit region 140 may be removed, such as by CMP, to isolate connections to the source 135.

Figure 14:
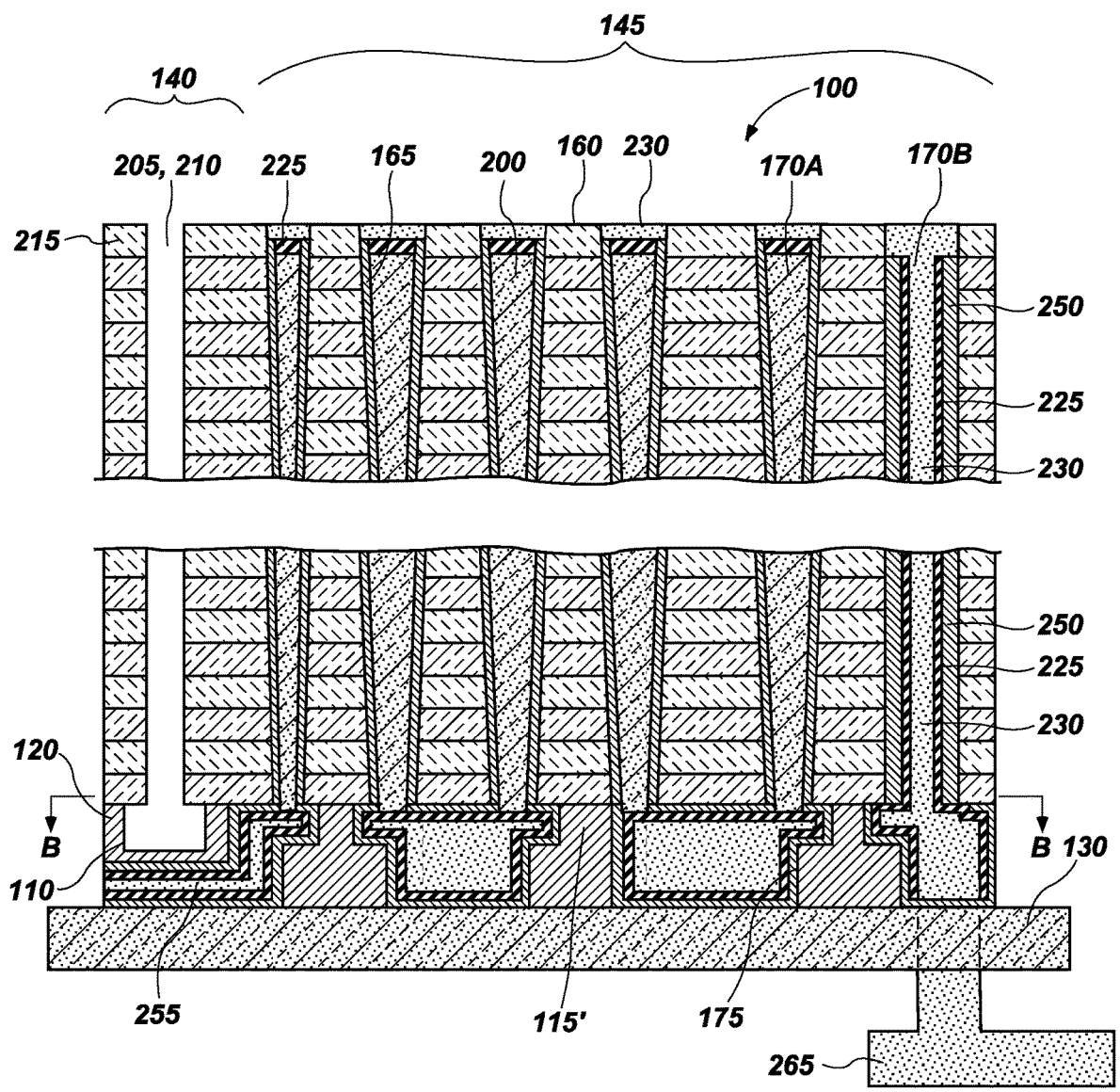

The slit 205 and slit opening 210 are formed in the slit region 140 by removing a portion of the tiers 180 overlying the isolated sacrificial structure 110, as shown in FIG. 14. Before forming the slit 205 and slit opening 210, an oxide material (not shown) may be formed over the drains 255 to provide protection from an etch chemistry and etch conditions utilized in the formation of the slit 205 and slit opening 210. The portion of the dielectric materials 185 and nitride materials 190 of the tiers 180 is removed to expose a top surface of the isolated sacrificial structure 110, as shown by the dashed line in FIG. 14. The isolated sacrificial structure 110, therefore, functions as an etch stop. The slit 205 is formed by conventional techniques. The isolated sacrificial structure 110 is then selectively removed, exposing sidewalls and a bottom horizontal surface of the oxide material 120 and extending the slit 205 to form the slit opening 210. The isolated sacrificial structure 110 is removed by conventional techniques. The nitride materials 190 of the tiers 180 are then selectively removed and conductive materials 215 formed in the resulting spaces as described above in relation to FIGS. 9A and 9B. Some of the resulting conductive materials 215 of the tiers 180 correspond to word lines (e.g., access lines) of the memory cells and other of the conductive materials 215 of the tiers 180 correspond to select gate sources/select gate drains of the memory cells. While one slit 205 is shown in FIG. 14, an additional slit(s) may be present for between every additional four tier openings 170 and nine tier openings 170 in the tiers 180. Therefore, the contact openings 245 are utilized to form the source 135 while the slit 205 is utilized to form the conductive materials 215 of the tiers 180 using the replacement gate process. The slit 205 and the slit opening 210 are filled with the slit dielectric material 260 as described above in relation to FIGS. 10A and 10B.

Figure 15:
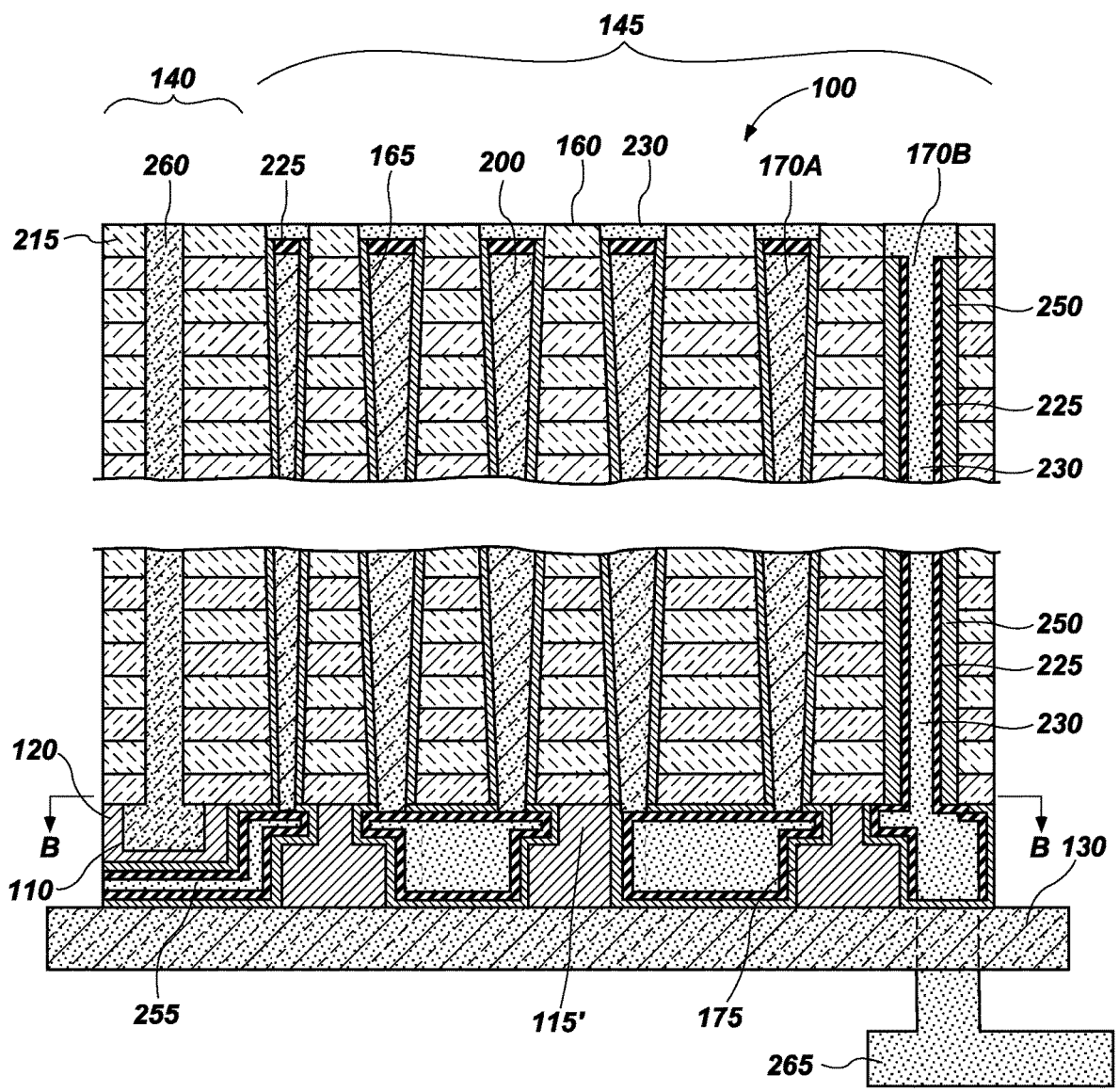

Power to the source 135 may be provided through the electrically conductive material as described above in relation to FIG. 11. By way of example only, the electrically conductive material may be configured as the interconnect 265 located below the source 135, as shown in FIG. 15. The interconnect 265 may be formed as described above in relation to FIG. 11. Therefore, the conductive material 230 of the source 135 is in electrical contact with the interconnect 265 as shown in FIGS. 14 and 15. The conductive material 230 provides electrical communication between the source 135 and the interconnect 265, providing power from the interconnect 265 to charge the source 135. While FIG. 14 illustrates the interconnect 265 as being below the source 135, the interconnect 265 may be located above the source 135.

By utilizing the contact openings 245 to provide access, the doped polysilicon material 225 and the conductive material 230 of the source 135 may be easily formed and electrically connected. Utilizing the contact openings 245 in the formation of the source 135 also enables substantially simultaneous dopant activation of the source 135 and of the drain 255 and substantially simultaneous formation of metallization in the source 135 and the drain 255. The dopant activation of the source 135 and of the drain 255 is conducted before the replacement gate process is conducted. Providing access utilizing the contact openings 245 may also be advantageous because substantially no fill material 200 is formed in the cavity 195. Therefore, no removal of the fill material 200 needs to be conducted before forming the doped polysilicon material 225 and the conductive material 230 in the contact openings 245. The number of acts utilized to form the source 135 may, therefore, be less utilizing the contact openings 245 for access.

While embodiments have been described herein utilizing the large tier openings 170B or the contact openings 245 to form the source 135, the large tier openings 170B may be used in combination with the contact openings 245 to form the source 135.

In the embodiments in which source access is provided through the large tier openings 170B or through the contact openings 245, the source 135 is positioned below the tiers 180 and below the cell films 165 in the tier openings 170 (170A, 170B) and above the insulative material 130. The conductive material 230 of the source 135 is surrounded by the cell material and the channel material of the cell film 165 and, therefore, the source 135 does not come into contact with the cell films 165 in the tier openings 170 (170A, 170B) or in the contact openings 245. The conductive material 230 of the source 135 is in electrical contact with the channel material of the cell film 165 in the tier openings 170 (170A, 170B) or in the contact openings 245. The doped polysilicon material 225 and the conductive material 230 in the large tier openings 170B or in the contact openings 245 are configured to charge the source 135 during use and operation of the semiconductor structure 100.

Since the source 135 in the cavity 195 is surrounded by the cell film 165, no pillar punch etch process is necessary to connect the cell material and channel material of the cell film 165 in the tier openings 170 to the source 135. The reliability and reproducibility of contact between the cell films 165 in the tier openings 170 and the source 135 is, therefore, improved, along with cell performance. Since no pillar punch etch process is conducted, multiple decks of the tiers 180 may be formed on top of one another and aligned without causing alignment problems, even when the cell films 165 are formed in high aspect ratio (HAR) openings, such as tier openings 170 having an aspect ratio of at least about 20:1, at least about 40:1, at least about 50:1, at least about 60:1, at least about 80:1, or at least about 100:1. Therefore, conducting the pillar punch etch process is not needed even as dimensions of the tier openings 170 continue to be scaled down.

Accordingly, a method of forming a semiconductor device is disclosed. The method comprises forming tiers adjacent to sacrificial structures and support pillars on a material and removing a portion of the tiers in a pillar region to form tier pillars and tier openings and to expose the sacrificial structures and the support pillars. The sacrificial structures are removed through the tier openings to form a cavity extending between a slit region and the pillar region. A cell film is formed over sidewalls of the tier pillars and over sidewalls of the cavity. A fill material is formed in the tier openings. A portion of the fill material is removed from the tier openings to form recesses adjacent to an uppermost tier. Contact openings are formed adjacent to the tier openings comprising the cell film and the fill material. The sacrificial structures below the contact openings are removed to extend the cavity and an oxide material is formed in the contact openings and in the cavity below the contact openings. A doped polysilicon material is formed in the recesses, in the cavity, and in the contact openings and a conductive material is formed in the recesses, in the cavity, and in the contact openings. An opening is formed in the slit region and a dielectric material is formed in the opening.

While FIGS. 1A-15 describe and illustrate the fabrication of a 3D NAND Flash memory device formed by a replacement gate process, embodiments of the disclosure may be used to form a 3D NAND Flash memory device by a floating gate process, where the conductive materials 215 are present initially in place of the nitride materials 190 of the replacement gate process. In the floating gate process, the tiers 180 initially include alternating dielectric materials 185 and conductive materials 215 instead of the alternating dielectric materials 185 and nitride materials 190. Therefore, in the process stage illustrated in FIGS. 2A and 2B, the conductive materials 215 are present at this stage instead of the nitride materials 190. The alternating dielectric materials 185 and conductive materials 215 are formed by conventional techniques.

Semiconductor devices including the source 135 formed in accordance with embodiments of the disclosure may be formed by conducting additional process acts, which are not described in detail herein.

Figure 16:
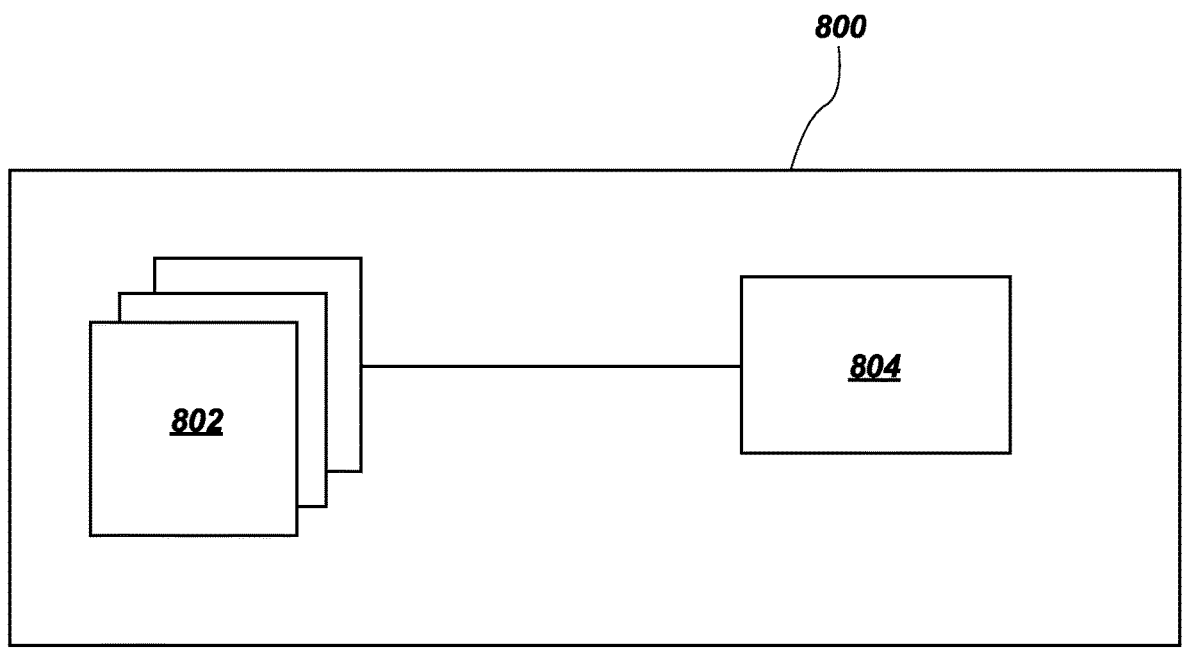
FIG. 16 is a schematic block diagram illustrating the semiconductor device comprising the source in accordance with embodiments of the disclosure.

A semiconductor device, such as a memory device 800, is also disclosed, as shown schematically in FIG. 16. The memory device 800 includes a memory array 802 of memory cells including the source 135 according to embodiments of the disclosure and a control logic component 804. The control logic component 804 may be configured to operatively interact with the memory array 802 so as to read, write, or re-fresh any or all memory cells within the memory array 802. The memory device 800 includes the memory array 802 formed over and electrically coupled to the source 135. The memory cells are coupled to access lines (e.g., word lines), and the access lines are coupled to control gates of the memory cells. A string of memory cells of the memory array 802 is coupled in series between a source line and a data line (e.g. a bit line).

Accordingly, a semiconductor device is disclosed and that comprises memory cells comprising tiers of alternating dielectric materials and conductive materials and a cell film adjacent to the tiers. A source is below the memory cells and surrounded by the cell film. The source is in electrical communication with the memory cells.

Figure 17:
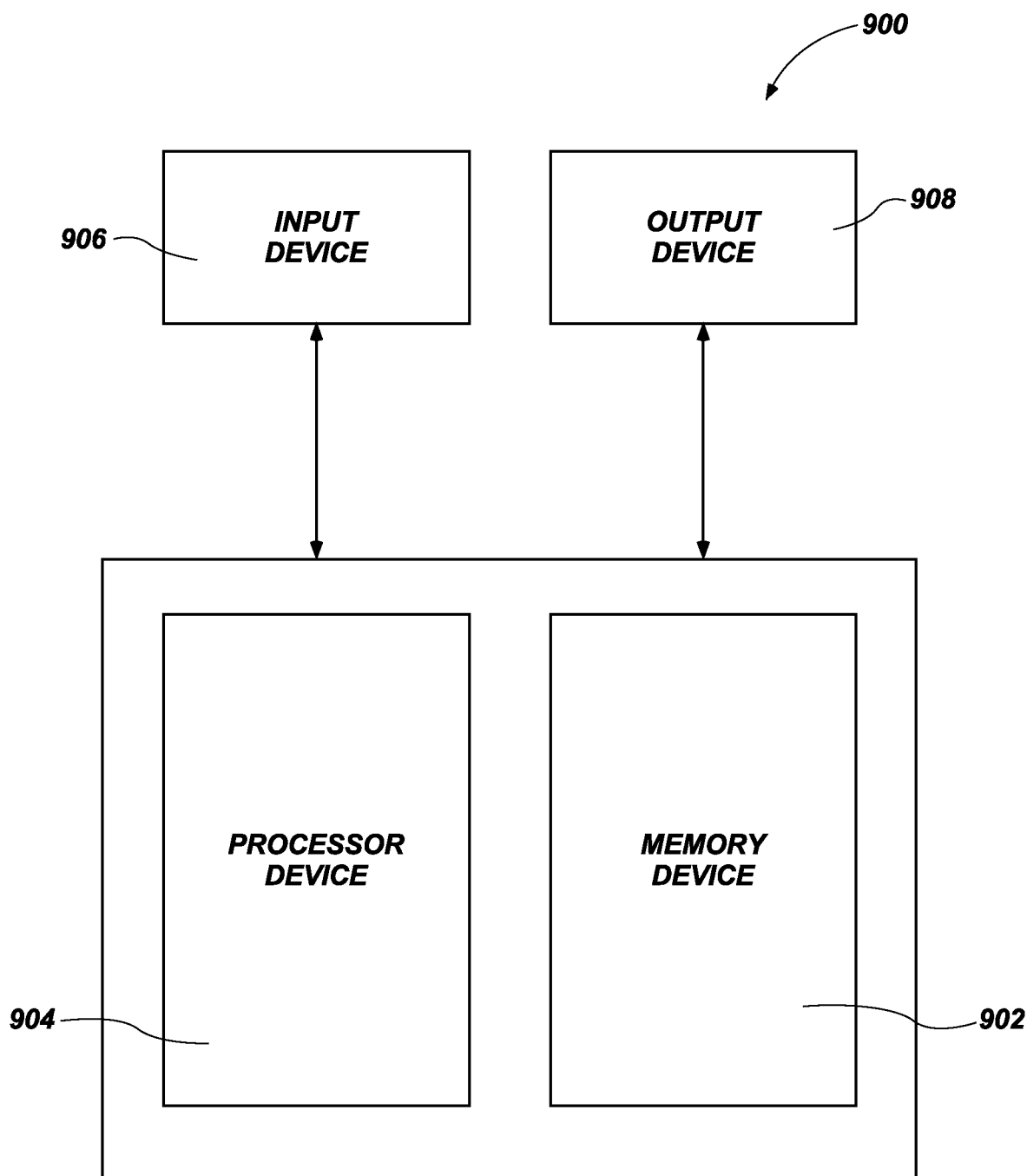
FIG. 17 is a schematic block diagram illustrating a system including semiconductor devices comprising the source in accordance with embodiments of the disclosure.

An electronic system 900 is also disclosed, as shown in FIG. 17, and includes at least one source 135 according to embodiments of the disclosure. FIG. 17 is a simplified block diagram of the electronic system 900 implemented according to one or more embodiments described herein. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 900 includes at least one memory device 902, which includes memory cells coupled to the source 135 as previously described. The electronic system 900 may further include at least one processor device 904 (often referred to as a "processor"). The processor device 904 may, optionally, include at least one source 135 as previously described. The electronic system 900 may further include one or more input devices 906 for inputting information into the electronic system 900 by a user, such as, for example, a mouse or other pointing device, a keyboard, a touchpad, a button, or a control panel. The electronic system 900 may further include one or more output devices 908 for outputting information (e.g., visual or audio output) to a user such as, for example, a monitor, a display, a printer, an audio output jack, a speaker, etc. In some embodiments, the input device 906 and the output device 908 may comprise a single touchscreen device that can be used both to input information to the electronic system 900 and to output visual information to a user. The one or more input devices 906 and output devices 908 may communicate electrically with at least one of the memory device 902 and the processor device 904. The at least one memory device 902 and processor device 904 may also be used in a system on chip (SoC).

Accordingly, a system comprising a source electrically connected to an array of memory cells is disclosed. The source is below the memory cells and surrounded by a cell film of the memory cells. A processor is in operative communication with at least one input device, at least one output device, and the memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
memory cells comprising tiers of alternating dielectric materials and conductive materials and a cell film adjacent to the tiers; and
a source below the memory cells and the source surrounded by the cell film, the source below the memory cells comprising separated portions, the source substantially free of air gaps, and the source in electrical communication with the memory cells.

2. An electronic device, comprising:
memory cells comprising tiers of alternating dielectric materials and conductive materials and a cell film adjacent to the tiers; and
a source below the memory cells and the source surrounded by the cell film, the source in electrical communication with the memory cells and the source comprising a doped polysilicon material and a conductive material, the doped polysilicon material below the tiers and the conductive material adjacent to the doped polysilicon material.

3. The electronic device of claim 2, wherein the cell film surrounds the doped polysilicon material and the conductive material.

4. The electronic device of claim 2, wherein the source comprises interconnected portions of the doped polysilicon material and the conductive material in a cavity.

5. The electronic device of claim 2, wherein the conductive material extends between the source and the tiers.

6. The electronic device of claim 1, wherein the source extends longitudinally between a slit region and a pillar region of the electronic device.

7. The electronic device of claim 1, further comprising drains in electrical communication with the source, the drains adjacent to an uppermost tier.

8. A system comprising:
- a source electrically connected to an array of memory cells, the source below the array of memory cells, the source surrounded by a cell film of the memory cells, and laterally adjacent portions of the source below the array of memory cells separated from one another, the laterally adjacent portions of the source consisting of one or more conductive materials; and
- a processor in operative communication with at least one input device, at least one output device, and the memory cells.

9. The system of claim 8, wherein the cell film is adjacent to sidewalls of tiers of alternating dielectric materials and conductive materials of the memory cells.

10. The system of claim 9, wherein the cell film comprises a cell material and a channel material on the sidewalls of the tiers.

11. The system of claim 9, wherein the sidewalls of the tiers define tier openings, the tier openings comprising an aspect ratio of greater than about 40:1.

12. The system of claim 8, further comprising an interconnect in electrical communication with the source.

13. An electronic device, comprising:
- memory cells comprising tiers of alternating dielectric materials and conductive materials and a cell film adjacent to the tiers and below the memory cells; and
- a source in electrical communication with the memory cells, a portion of the source below the memory cells and surrounded by the cell film, and the portion of the source below the memory cells comprising interconnected segments of the source separated from one another and that are substantially free of air gaps.

14. The electronic device of claim 13, wherein the source comprises one or more conductive materials comprising one or more of doped polysilicon material, a tungsten-containing material, a titanium-containing material, or a combination thereof.

15. The electronic device of claim 13, further comprising another portion of the source laterally adjacent to the memory cells, a fill material direct contacting the portion of the source below the memory cells.

16. The electronic device of claim 1, wherein the source below the memory cells is in a cavity and one or more conductive materials of the source substantially completely fill the cavity.

17. The electronic device of claim 1, wherein the separated portions of the source are laterally adjacent to one another.

18. The system of claim 8, wherein the laterally adjacent portions of the source are separated from one another by support pillars.

* * * * *